US012764963B2

(12) United States Patent
Luo et al.

(10) Patent No.: US 12,764,963 B2
(45) Date of Patent: Oct. 13, 2026

(54) METHODS OF FORMING MICROELECTRONIC DEVICES

(71) Applicant: Micron Technology, Inc., Boise, ID (US)

(72) Inventors: Shuangqiang Luo, Boise, ID (US); Lifang Xu, Boise, ID (US); Xiao Li, Boise, ID (US); Jivaan Kishore Jhothiraman, Meridian, ID (US); Mohad Baboli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 18/623,507

(22) Filed: Apr. 1, 2024

(65) Prior Publication Data

US 2024/0250033 A1 Jul. 25, 2024

Related U.S. Application Data

(62) Division of application No. 17/643,061, filed on Dec. 7, 2021, now Pat. No. 11,978,705.

(51) Int. Cl.
*H10B 43/50* (2023.01)
*H10B 43/27* (2023.01)

(52) U.S. Cl.
CPC ............. *H10B 43/50* (2023.02); *H10B 43/27* (2023.02)

(58) Field of Classification Search
CPC ........ H10B 41/27; H10B 41/50; H10B 43/27; H10B 43/50
See application file for complete search history.

(56) References Cited

U.S. PATENT DOCUMENTS 9,425,209 B1 8/2016 Yang et al.
2017/0256551 A1 9/2017 Lee
(Continued)

FOREIGN PATENT DOCUMENTS

CN 111316441 A 6/2020
TW 201943041 A 11/2019
(Continued)

OTHER PUBLICATIONS

European Extended Search Report and Opinion for European Application No. 22905228.7, dated Mar. 14, 2025, 10 pages.
(Continued)

*Primary Examiner* — Yu Chen
(74) *Attorney, Agent, or Firm* — TraskBritt

(57) ABSTRACT

A microelectronic device comprises a stack structure comprising an alternating sequence of conductive material and insulative material arranged in tiers, and having blocks separated by dielectric slot structures. Each of the blocks comprises a stadium structure, a filled trench overlying the stadium structure, support structures extending through the filled trench and tiers of the stack structure, and dielectric liner structures covering sidewalls of the support structures. The stadium structure comprises staircase structures each having steps comprising edges of the tiers of the stack structure. The filled trench comprises a dielectric material interposed between at least two additional dielectric materials. The dielectric liner structures comprise first protrusions at vertical positions of the dielectric material, and second protrusions at vertical positions of the conductive material of the tiers of the stack structure. The second protrusions have greater horizontal dimensions than the first protrusions. Memory devices, electronic systems, and methods are also described.

20 Claims, 22 Drawing Sheets

(56) References Cited

U.S. PATENT DOCUMENTS

| | | | | |
|---|---|---|---|---|
| 2019/0280003 | A1 | 9/2019 | Mushiga et al. | |
| 2020/0152654 | A1 | 5/2020 | Hwang et al. | |
| 2021/0126010 | A1 | 4/2021 | Luo et al. | |
| 2021/0210499 | A1 | 7/2021 | Jhothiraman et al. | |
| 2021/0358843 | A1 | 11/2021 | Scarbrough et al. | |
| 2021/0358868 | A1 | 11/2021 | Jhothiraman et al. | |
| 2021/0366920 | A1 | 11/2021 | Tokita et al. | |
| 2022/0189875 | A1* | 6/2022 | Sung | H10B 43/10 |
| 2023/0064713 | A1 | 3/2023 | Shimomura | |
| 2023/0069420 | A1* | 3/2023 | Zhang | H10B 43/27 |
| 2024/0170393 | A1* | 5/2024 | Wu | H10B 43/50 |

FOREIGN PATENT DOCUMENTS

| | | | |
|---|---|---|---|
| TW | 1701812 | B | 8/2020 |
| TW | 202114147 | A | 4/2021 |
| TW | 202137462 | A | 10/2021 |

OTHER PUBLICATIONS

Korean Notice of Reasons for Rejection for Korean Application No. 10-2024-7021749, dated Mar. 31, 2025, 6 pages with English translation.
Taiwanese Search Report from Taiwanese Application No. 113127260, dated Nov. 1, 2024, 2 pages.
International Search Report for International Application No. PCT/US2022/079661, mailed Mar. 16, 2023, 4 pages.
International Written Opinion for International Application No. PCT/US2022/079661, mailed Mar. 16, 2023, 6 pages.
Taiwanese Search Report and Office Action from Taiwanese Application No. 111145375, dated Aug. 30, 2023, 4 pages.

* cited by examiner

METHODS OF FORMING MICROELECTRONIC DEVICES

CROSS-REFERENCE TO RELATED APPLICATION

This application is a divisional of U.S. patent application Ser. No. 17/643,061, filed Dec. 7, 2021, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through one or more stack structures including tiers of conductive material and insulative material. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices. Unfortunately, as feature packing densities have increased and margins for formation errors have decreased, conventional fabrication methods and resulting structural configurations have resulted in undesirable defects that can diminish desired memory device performance, reliability, and durability.

DETAILED DESCRIPTION

Figure 1:
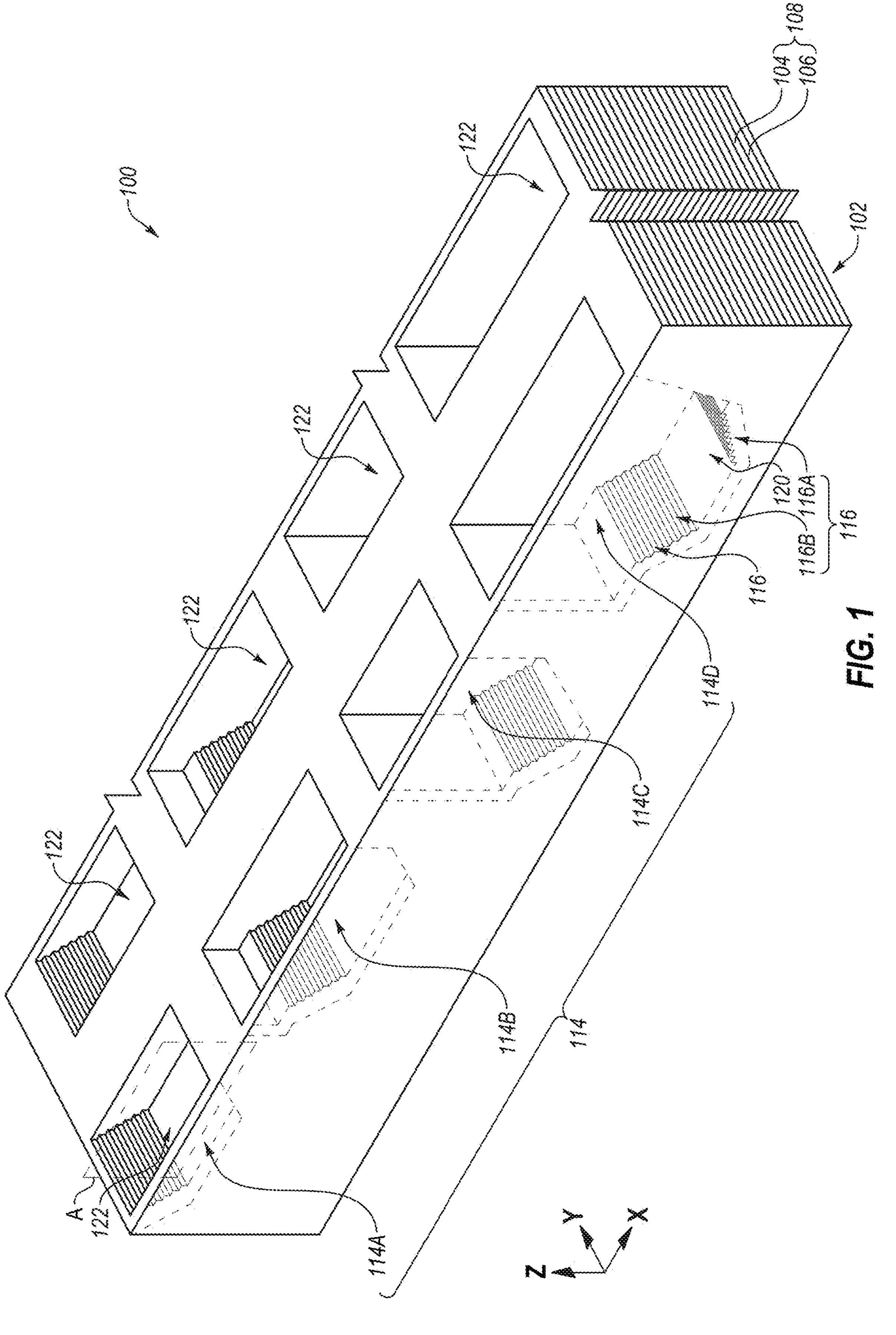
FIG. 1 is a simplified, partial perspective view of a microelectronic device structure at a processing stage of a method forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 through FIG. 8C are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 2A:
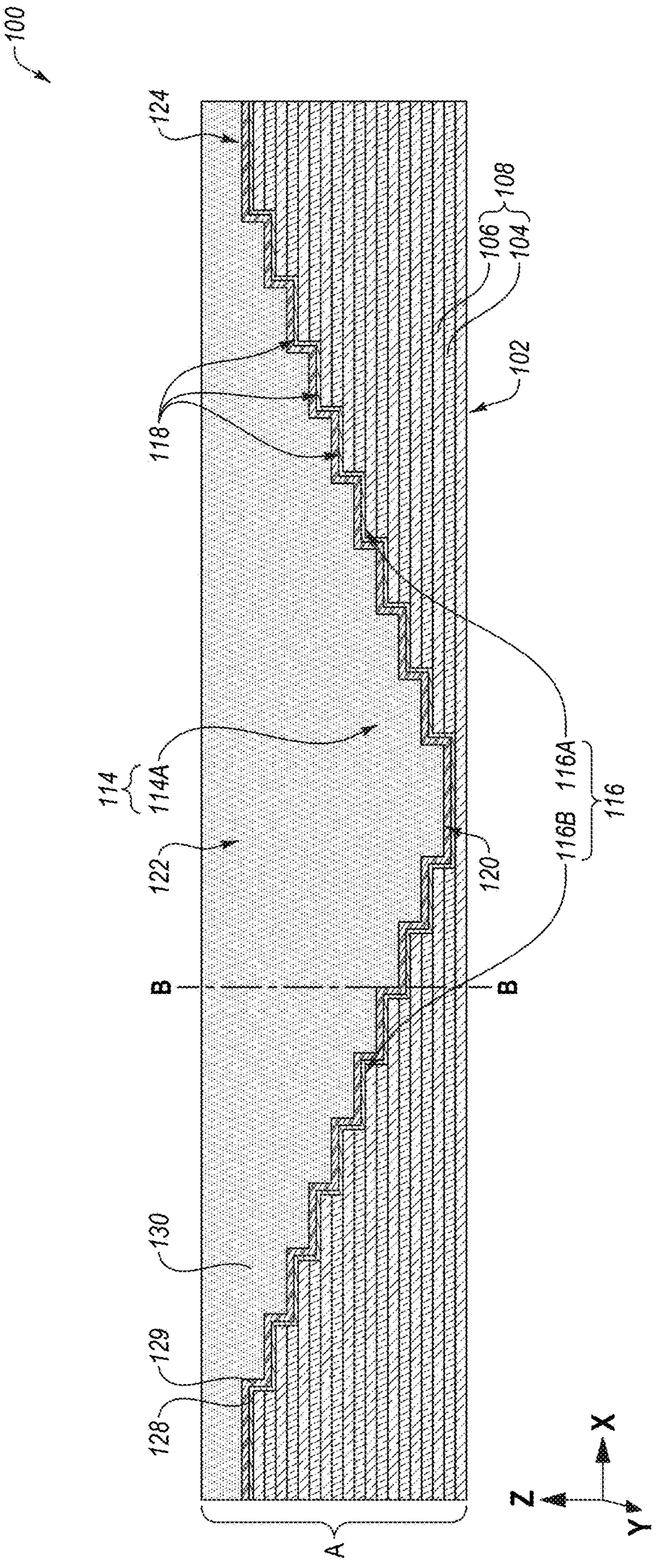
FIG. 2A is a simplified, longitudinal cross-sectional view of a portion A (identified with dashed lines in FIG. 1) of the microelectronic device structure shown in FIG. 1.

FIG. 1 depicts a simplified, partial perspective view of a microelectronic device structure 100. As shown in FIG. 1, the microelectronic device structure 100 may be formed to include a preliminary stack structure 102 including a vertically alternating (e.g., in a Z-direction) sequence of insulative material 104 and sacrificial material 106 arranged in tiers 108. Each of the tiers 108 of the preliminary stack structure 102 may individually include the sacrificial material 106 vertically neighboring (e.g., directly vertically adjacent) the insulative material 104. Additional features (e.g., materials, structures) of the preliminary stack structure 102 are described in further detail below. FIG. 2A is a simplified, longitudinal cross-sectional view of a portion A (identified with a dashed box in FIG. 1) of the microelectronic device structure 100 at the processing stage depicted in FIG. 1.

The insulative material 104 of each of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 104 of each of the tiers 108 of the preliminary stack structure 102 may be formed of and include a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and at least one semiconductive material (e.g., polycrystalline silicon). In some embodiments, the sacrificial material 106 of each of the tiers 108 of the preliminary stack structure 102 may be formed of and include a dielectric nitride material, such as $SiN_y$ (e.g., $Si_3N_4$). The sacrificial material 106 may, for example, be selectively etchable relative to the insulative material 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

As shown in FIG. 1, the preliminary stack structure 102 includes stadium structures 114 formed therein. As shown in FIG. 1, the preliminary stack structure 102 may include rows of the stadium structures 114 extending in parallel in a X-direction, and columns of the stadium structures 114 extending in a Y-direction orthogonal to the X-direction. The rows of the stadium structures 114 may individually include some of the stadium structures 114 at least partially (e.g., substantially) aligned with one another in the Y-direction. The columns of the of the stadium structures 114 may individually include other of the stadium structures 114 at least partially (e.g., substantially) aligned with one another in the X-direction. Different rows of the stadium structures 114 may be positioned within different horizontal areas of the preliminary stack structure 102 to be formed into different blocks of a stack structure to be formed from the preliminary stack structure 102, as described in further detail below. In FIG. 1, for clarity and case of understanding the drawings and associated description, portions of the preliminary stack structure 102 are depicted as transparent to more clearly show some of the stadium structures 114 distributed within the preliminary stack structure 102.

At least some (e.g., each) of the stadium structures 114 within an individual row of the stadium structures 114 may be positioned at different vertical elevations in the Z-direction than one another. For example, as depicted in FIG. 1, an individual row of the stadium structures 114 may include a first stadium structure 114A, a second stadium structure 114B at a relatively lower vertical position (e.g., in the Z-direction) within the preliminary stack structure 102 than the first stadium structure 114A, a third stadium structure 114C at a relatively lower vertical position within the preliminary stack structure 102 than the second stadium structure 114B, and a fourth stadium structure 114D at a relatively lower vertical position within the preliminary stack structure 102 than the third stadium structure 114C. In addition, within an individual row of the stadium structures 114, horizontally neighboring (e.g., in the X-direction) stadium structures 114 may be substantially uniformly (e.g., equally, evenly) horizontally spaced apart from one another. In additional embodiments, one or more rows of the stadium structures 114 may individually include a different quantity of stadium structures 114 and/or a different distribution of stadium structures 114 than that depicted in FIG. 1. For example, an individual row of the stadium structures 114 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). As another example, within an individual row of the stadium structures 114, stadium structures 114 may be at least partially non-uniformly (e.g., non-equally, non-evenly) horizontally spaced, such that at least one of the stadium structures 114 may be separated from at least two other of the stadium structures 114 horizontally neighboring (e.g., in the X-direction) the at least one stadium structure 114 by different (e.g., non-equal) distances. As an additional non-limiting example, within an individual row of the stadium structures 114, vertical positions (e.g., in the Z-direction) of the stadium structures 114 may vary in a different manner (e.g., may alternate between relatively deeper and relatively shallower vertical positions) than that depicted in FIG. 1.

Each stadium structure 114 may include opposing staircase structures 116, and a central region 120 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1. As a non-limiting example, at least one stadium structure 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 120 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure 116B) of an individual stadium structure 114 each include steps 118 defined by edges (e.g., horizontal ends) of the tiers 108 of the preliminary stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 120 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 120 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 120 of the stadium structure 114.

Each of the stadium structures 114 of the preliminary stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1, in some embodiments, the steps 118 of each of the stadium structures 114 are arranged in order, such that steps 118 directly horizontally adjacent (e.g., in the X-direction) one another correspond to tiers 108 of the preliminary stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of preliminary stack structure 102 not directly vertically adjacent (e.g., in the Z-direction) one another. In some embodiments, an individual stadium structure 114 may be horizontally continuous (e.g., in the Y-direction) such that there is no horizontal region (e.g., in the Y-direction) separating stadium structures 114.

With continued reference to FIG. 1, for an individual stadium structure 114, the central region 120 thereof may horizontally intervene (e.g., in the X-direction) between and separate the forward staircase structure 116A thereof from the reverse staircase structure 116B thereof. The central region 120 may horizontally neighbor a vertically lowermost step 118 of the forward staircase structure 116A, and may also horizontally neighbor a vertically lowermost step 118 of the reverse staircase structure 116B. The central region 120 of an individual stadium structure 114 may have any desired horizontal dimensions. In addition, within an individual preliminary stack structure 102, the central region 120 of each of the stadium structures 114 may have substantially the same horizontal dimensions as the central region 120 of each other of the stadium structures 114, or the central region 120 of at least one of the stadium structures 114 may have different horizontal dimensions than the central region 120 of at least one other of the stadium structures 114.

Each stadium structure 114 (including the forward staircase structure 116A, the reverse staircase structure 116B, and the central region 120 thereof) within the preliminary stack structure 102 may individually partially define boundaries (e.g., horizontal boundaries, vertical boundaries) of a filled trench 122 vertically extending (e.g., in the Z-direction) through the preliminary stack structure 102. The portions of the preliminary stack structure 102 horizontally neighboring an individual stadium structure 114 may also partially define the boundaries of the filled trench 122 associated with the stadium structure 114. The filled trench 122 may only vertically extend through tiers 108 of the preliminary stack structure 102 defining the forward staircase structure 116A and the reverse staircase structure 116B of the stadium structure 114; or may also vertically extend through additional tiers 108 of the preliminary stack structure 102 not defining the forward staircase structure 116A and the reverse staircase structure 116B of the stadium structure 114, such as additional tiers 108 of the preliminary stack structure 102 vertically overlying the stadium structure 114. Edges of the additional tiers 108 of the preliminary stack structure 102 may, for example, define one or more additional stadium structures vertically overlying and horizontally offset from the stadium structure 114. The filled trench 122 may be filled with one or more dielectric materials, as described in further detail below with reference to FIG. 2A.

As previously described, FIG. 2A is a simplified, longitudinal cross-sectional view of portion A (identified with a dashed box in FIG. 1) of the microelectronic device structure 100 at the processing stage depicted in FIG. 1. The portion A encompasses the first stadium structure 114A of an individual row of the stadium structures 114 of the preliminary stack structure 102 (FIG. 1). The portion A also encompasses the regions of the preliminary stack structure 102 horizontally neighboring the first stadium structure 114A in the Y-direction; and the filled trench 122 having boundaries defined by the first stadium structure 114A, and the regions of the preliminary stack structure 102 horizontally neighboring the first stadium structure 114A. While additional features (e.g., structures, materials) of the microelectronic device structure 100 are described herein below with reference to the portion A of the microelectronic device structure 100, such additional features may also be formed and included in additional portions of the microelectronic device structure 100, including additional portions encompassing additional stadium structures 114 of the preliminary stack structure 102 (FIG. 1), and additional regions of the preliminary stack structure 102 and additional filled trenches 122 having boundaries defined by the additional stadium structures 114.

The filled trenches 122 may individually be filled with multiple (e.g., more than one) dielectric materials. For example, as shown in FIG. 2A, each filled trench 122 may include a first dielectric material 128 (e.g., a dielectric liner material), a second dielectric material 129 (e.g., an additional dielectric liner material), and a third dielectric material 130 (e.g., a dielectric fill material). For an individual filled trench 122, the first dielectric material 128 may be formed on or over surfaces (e.g., horizontally extending surfaces, vertically extending surfaces) of the stadium structure 114 (e.g., the first stadium structure 114A) and regions of the preliminary stack structure 102 horizontally neighboring and partially defining boundaries (e.g., horizontal boundaries, vertical boundaries) of the filled trench 122; the second dielectric material 129 may be formed on or over the first dielectric material 128; and the third dielectric material 130 may be formed on or over the second dielectric material 129. One or more (e.g., each) of the first dielectric material 128, the second dielectric material 129, and the third dielectric material 130 may also be formed to extend beyond boundaries (e.g., horizontal boundaries, vertical boundaries) of the filled trenches 122. For example, first dielectric material 128, the second dielectric material 129, and the third dielectric material 130 may also be formed to extend over uppermost surfaces of the regions of the preliminary stack structure 102 (FIG. 1) horizontally neighboring the filled trenches 122.

The first dielectric material 128 may be employed (e.g., serve) as a barrier material to protect (e.g., mask) the second dielectric material 129 from removal during subsequent processing acts (e.g., subsequent etching acts), as described in further detail below. The first dielectric material 128 may be formed to have a desired thickness capable of protecting the second dielectric material 129 during the subsequent processing acts. The first dielectric material 128 may be formed to substantially continuously extend on or over surfaces of the preliminary stack structure 102. The first dielectric material 128 may substantially continuously extend on or over surfaces of the opposing staircase structures 116 (e.g., the forward staircase structure 116A and the reverse staircase structure 116B) of each of the stadium structures 114 (e.g., the first stadium structure 114A, the second stadium structure 114B, the third stadium structure 114C, the fourth stadium structure 114D), as well as on or over inner sidewalls of regions of the preliminary stack structure 102 horizontally neighboring (e.g., in the Y-direction) the stadium structures 114.

The first dielectric material 128 may be formed of and include at least one dielectric material having different etch selectivity than the sacrificial material 106 of the tiers 108 of the preliminary stack structure 102. The first dielectric material 128 may also have different etch selectivity than the second dielectric material 129. The first dielectric material 128 may, for example, have etch selectively substantially similar to that of the insulative material 104 of the tiers 108 of the preliminary stack structure 102. By way of non-limiting example, the first dielectric material 128 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the first dielectric material 128 may be formed of and include $SiO_x$ (e.g., $SiO_2$).

The second dielectric material 129 may be employed (e.g., serve) as an etch stop material during subsequent processing acts (e.g., subsequent etching acts) to form openings (e.g., contact openings, contact vias) vertically extending through the third dielectric material 130, as described in further detail below. The second dielectric material 129 may be formed to have a desired thickness capable of protecting the first dielectric material 128 underlying the second dielectric material 129 from removal during the subsequent processing acts. By way of non-limiting example, the second dielectric material 129 may be formed to have a thickness about or greater than 10 nm. In some specific embodiments, the second dielectric material 129 may be formed to have a thickness between 10 nm and 40 nm. The second dielectric material 129 may be formed to substantially continuously extend on or over the first dielectric material 128.

The second dielectric material 129 may be formed of and include at least one dielectric material having different etch selectivity than the third dielectric material 130, the first dielectric material 128, the sacrificial material 106, and the insulative material 104. The second dielectric material 129 and the sacrificial material 106 may each be selectively etchable relative to the third dielectric material 130, the first dielectric material 128, and the insulative material 104 upon mutual exposure to an etchant. However, an etch rate of the sacrificial material 106 during exposure to the etchant is relatively faster than an etch rate of the second dielectric material 129 during exposure to the etchant. In some embodiments, a density of the second dielectric material 129 is greater than a density of the sacrificial material 106. In some embodiments, the second dielectric material 129 is formed of and includes at least one nitrogen-containing dielectric material (e.g., dielectric nitride material, such as $SiN_y$) having a greater density than at least one additional nitrogen-containing dielectric material (e.g., additional dielectric nitride material, such as additional $SiN_y$) of the sacrificial material 106 of the tiers 108 of the preliminary stack structure 102. By way of non-limiting example, the second dielectric material 129 may be formed of and included a relatively higher-density dielectric nitride material formed at a relatively higher temperature than a relatively lower-density dielectric nitride material of the of the sacrificial material 106 of the tiers 108 of the preliminary stack structure 102. In some embodiments, a temperature greater than or equal to about 630° C. is employed to form the second dielectric material 129. For example, the second dielectric material may be formed using at least one material deposition process (e.g., at least one CVD process) employing a temperature within a range of from about 680° C. and about 760° C. In some embodiments, the second dielectric material 129 is formed of and includes $Si_3N_4$. Still referring to FIG. 2A, the third dielectric material 130 may substantially fill portions of the filled trenches 122 unoccupied by the first dielectric material 128 and the second dielectric material 129. The third dielectric material 130 may be formed to substantially continuously extend on or over the second dielectric material 129. The third dielectric material 130 may be formed to exhibit a substantially planer upper vertical boundary, and a substantially non-planar lower vertical boundary complementary to (e.g., substantially mirroring) a topography thereunder.

The third dielectric material 130 may be formed of and include at least one dielectric material having different etch selectivity than the second dielectric material 129. The third dielectric material 130 may, for example, have etch selectively substantially similar to that of one or more of the first dielectric material 128 the insulative material 104 of the tiers 108 of the preliminary stack structure 102. By way of non-limiting example, the third dielectric material 130 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the third dielectric material 130 may be formed of and include $SiO_x$ (e.g., $SiO_2$).

Figure 2B:
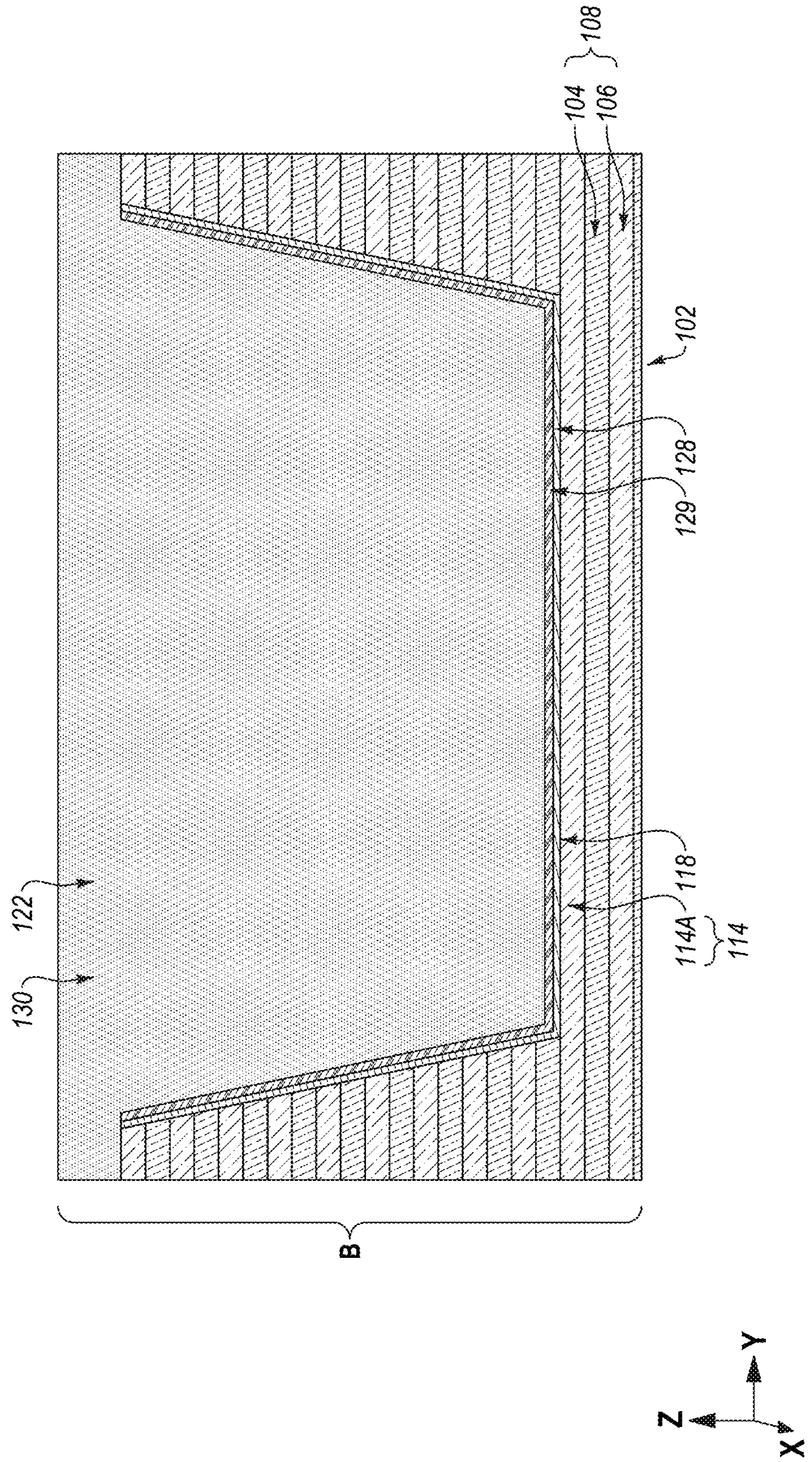
FIG. 2B is a simplified, partial longitudinal cross-sectional view of a portion of the microelectronic device structure at the processing stage of FIG. 2A about a dashed line B-B shown in FIG. 2A.

Referring to FIG. 2B, which is a simplified, longitudinal cross-sectional view of the portion B-B shown in FIG. 2A of the microelectronic device structure 100 at the processing stage of FIG. 2A, the first dielectric material 128 and the second dielectric material 129 may be formed to substantially continuously extend on or over surfaces of the preliminary stack structure 102 horizontally neighboring the filled trenches 122. For example, first dielectric material 128 may be formed to substantially continuously extend on or over inner side surfaces of insulative materials 104 and the sacrificial materials 106 defining outer boundaries of the filled trenches 122; and the second dielectric material 129 may be formed to substantially continuously extend on or over surfaces of the first dielectric material 128.

Figure 3A:
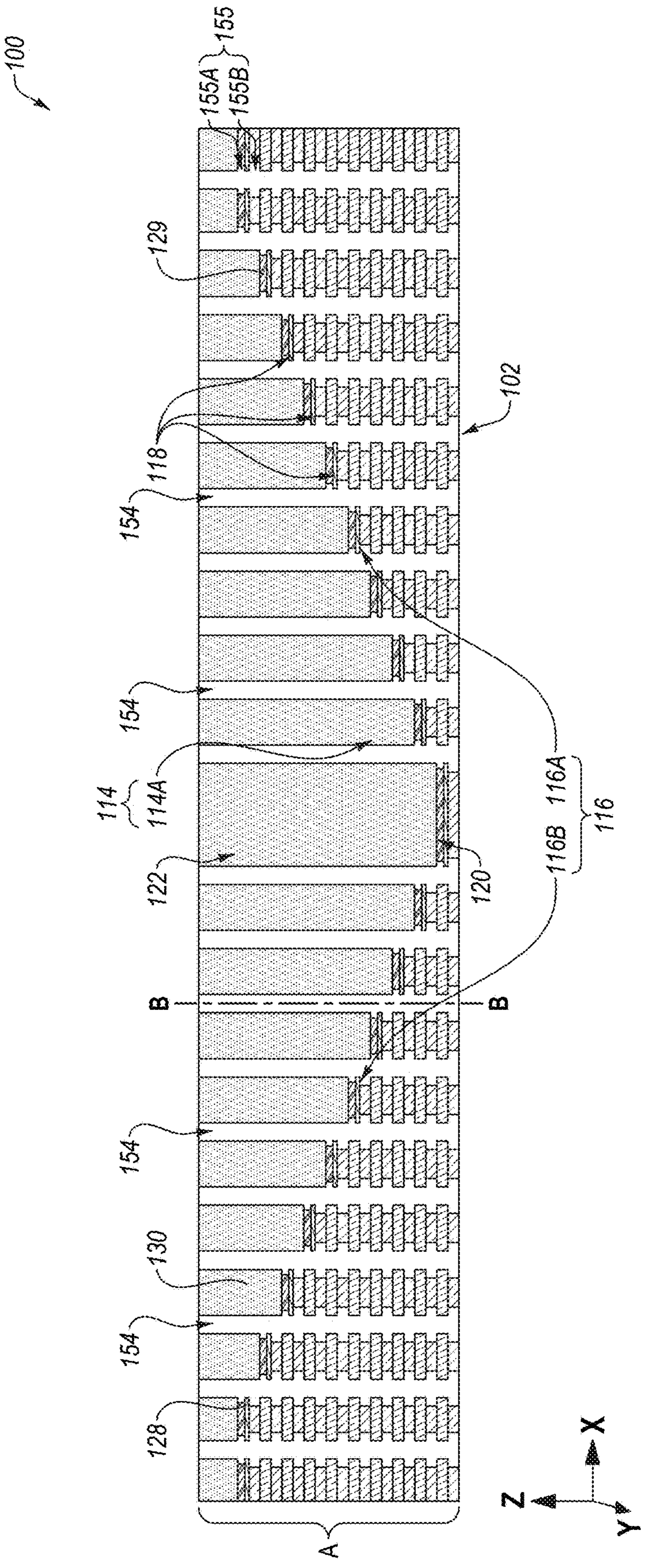
FIG. 3A is a simplified, longitudinal cross-sectional view of the portion A of the microelectronic device structure shown in FIGS. 1 and 2A at another processing stage of the method forming the microelectronic device following the processing stage of FIGS. 2A and 2B.
Figure 3B:
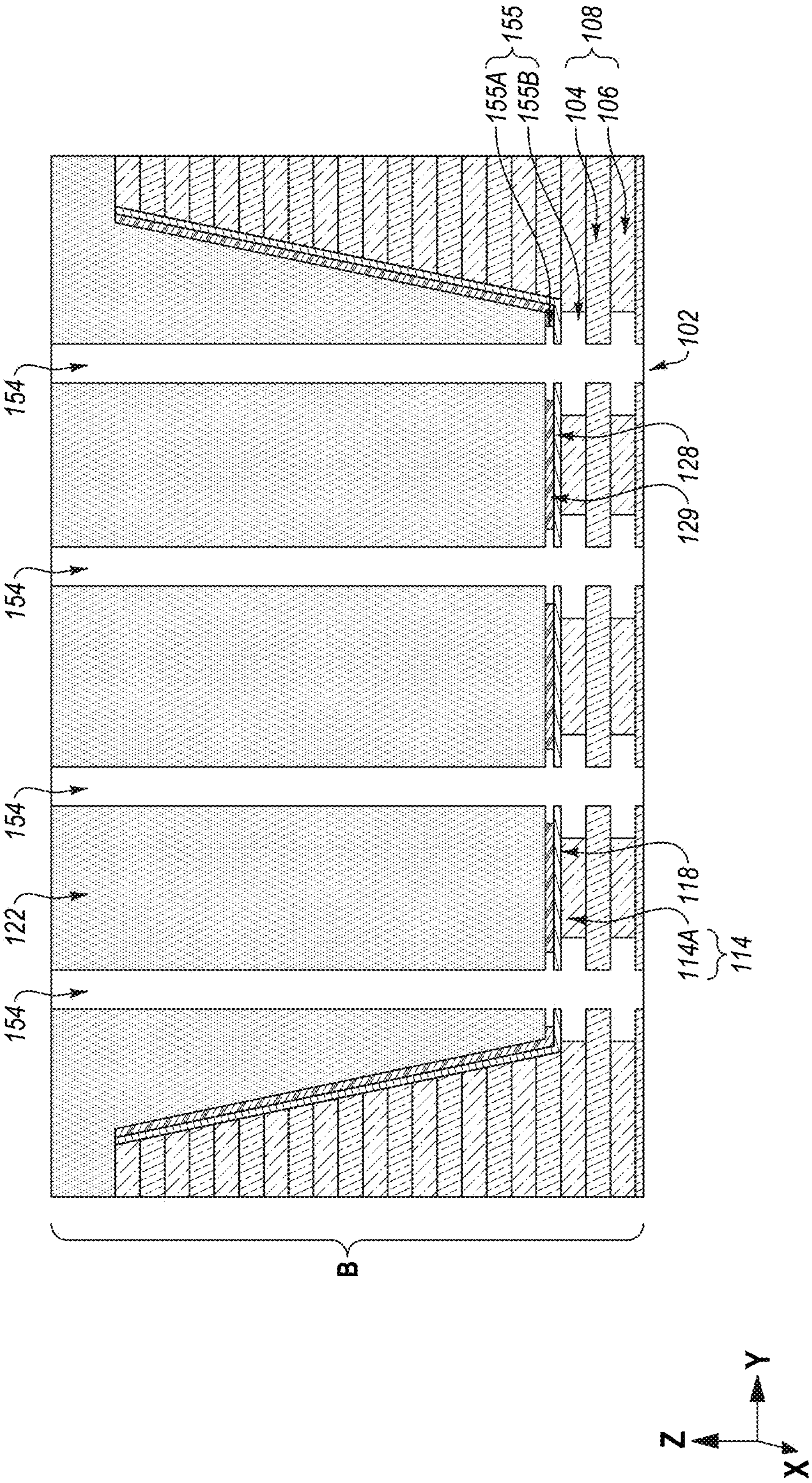
FIG. 3B is a simplified, partial longitudinal cross-sectional view of a portion of the microelectronic device structure at the processing stage of FIG. 3A about a dashed line B-B shown in FIG. 3A.
Figure 3C:
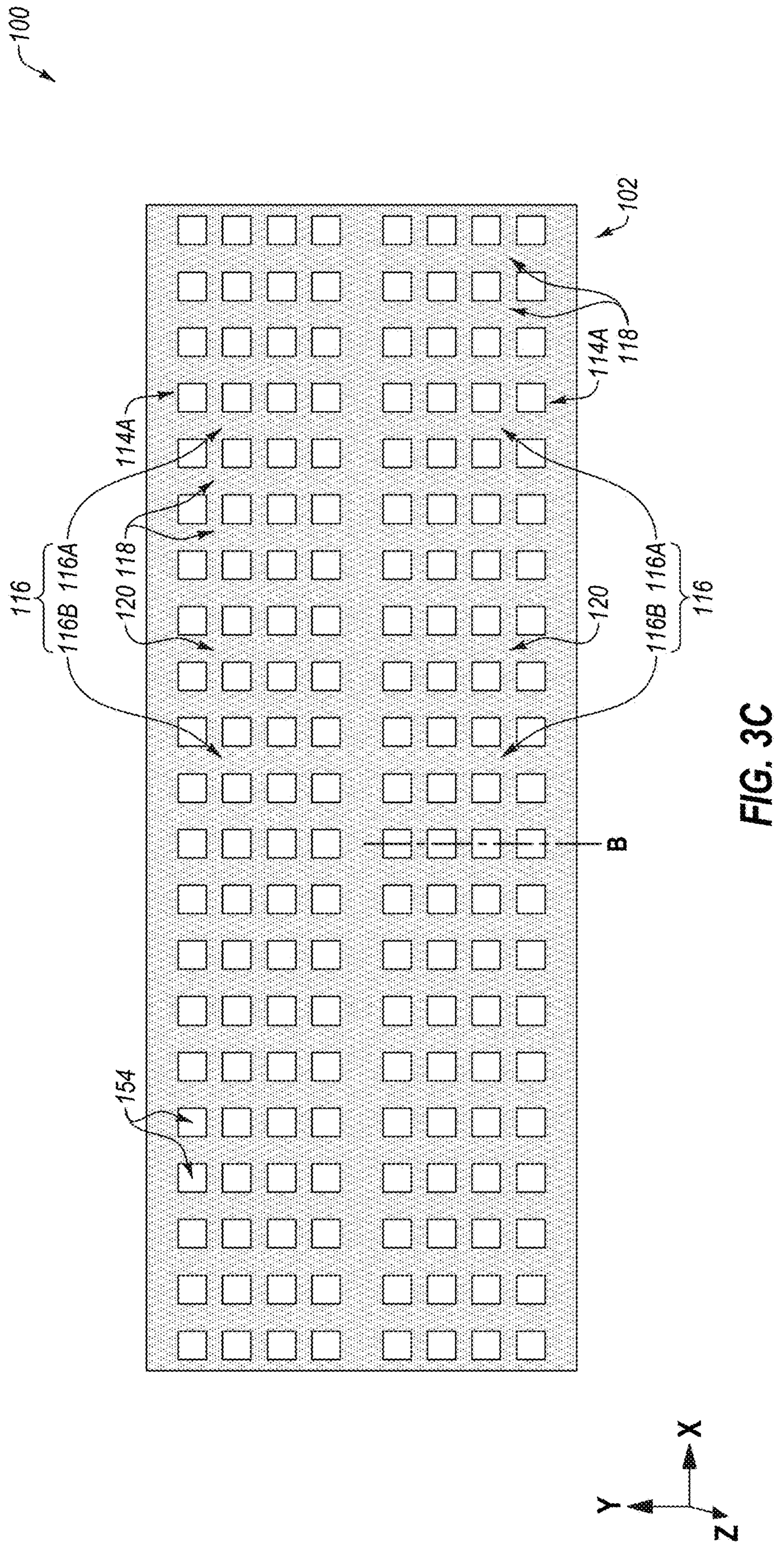
FIG. 3C is a simplified, partial top-down view of the microelectronic device structure at the processing stage of FIG. 3A.

Referring to FIG. 3A, which is a simplified, longitudinal cross-sectional view of the portion A of the microelectronic device structure 100 following (e.g., subsequent to) the processing stage previously described with reference to FIGS. 1, 2A, and 2B, first openings 154 may be formed to vertically extend (e.g., in the Z-direction) through the filled trenches 122 (including the third dielectric material 130, the second dielectric material 129, and the first dielectric material 128 thereof) and portions of the preliminary stack structure 102 vertically underlying and within horizontal areas of the filled trenches 122. As described in further detail below, each of the first openings 154 may be formed to include projecting portions 155 outwardly horizontally extending into the second dielectric material 129 and the sacrificial material 106 of tiers 108 of the preliminary stack structure 102 vertically underlying and within horizontal areas of the filled trenches 122 and first openings 154. FIG. 3B is a simplified, partial longitudinal cross-sectional view of a portion of the microelectronic device structure at the processing stage of FIG. 3A about a dashed line B-B shown in FIG. 3A. FIG. 3C is a simplified, partial top-down view of the microelectronic device structure at the processing stage of FIG. 3A.

As shown in FIG. 3A, the first openings 154 may be formed to be horizontally positioned at horizontal ends (e.g., in the X direction) of the steps 118 of the staircase structures 116 of the stadium structures 114. The first openings 154 may individually horizontally extend into boundaries of horizontally neighboring steps 118 of individual staircase structures 116.

The first openings 154 may each individually be formed to exhibit a desired horizontal cross-sectional shape. In some embodiments, each of the first openings 154 may be formed to exhibit a substantially circular horizontal cross-sectional shape. In additional embodiments, one or more (e.g., each) of the first openings 154 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the first openings 154 may be formed to exhibit substantially the same horizontal cross-sectional dimensions (e.g., substantially the same horizontal diameter), or at least one of the first openings 154 may be formed to exhibit one or more different horizontal cross-sectional dimensions (e.g., a different horizontal diameter) than at least one other of the first openings 154. In some embodiments, all of the first openings 154 are formed to exhibit substantially the same horizontal cross-sectional dimensions.

As shown in FIGS. 3A and 3B, the projecting portions 155 of first openings 154 may include first projecting portions 155A and second projecting portions 155B. The first projecting portions 155A of the first openings 154 may be located at vertical positions of horizontally extending portions of the second dielectric material 129 vertically neighboring the steps 118 of the staircase structures 116 of the stadium structures 114. The first projecting portions 155A of the first openings 154 may be formed by removing (e.g., horizontally recessing) portions of the second dielectric material 129. The second projecting portions 155B of the first openings 154 may be located at vertical positions of the sacrificial material 106 of tiers 108 of the preliminary stack structure 102 vertically underlying and within horizontal areas of the filled trenches 122. The second projecting portions 155B of the first openings 154 may be formed by removing (e.g., horizontally recessing) portions of the sacrificial material 106 of the tiers 108 of the preliminary stack structure 102 vertically underlying and within horizontal areas of the filled trenches 122.

As shown in FIGS. 3A and 3B, the first projecting portions 155A of the first openings 154 may exhibit relatively smaller horizontal dimensions (e.g., in the X-direction, in the Y-direction) than the second projecting portions 155B of the first openings 154. The smaller horizontal dimensions of the first projecting portions 155A relative to the second projecting portions 155B may result from a relatively slower etch rate of the second dielectric material 129 as compared to the sacrificial material 106 during mutual (e.g., common) exposure to an etchant employed to form the first openings 154. As previously described, the relatively slower etch rate of the second dielectric material 129 may be effectuated by a relatively higher density of the second dielectric material 129 as compared to the sacrificial material 106. As a result of the smaller horizontal dimensions of the first projecting portions 155A of the first openings 154, remaining portions of the second dielectric material 129 horizontally neighboring the first projecting portions 155A may exhibit relatively greater horizontal dimensions than otherwise possible if the second dielectric material 129 was not configured to have a relatively greater density (and a relatively slower etching rate) than the sacrificial material 106 of the tiers 108 of the preliminary stack structure 102. The relatively greater horizontal dimensions of the remaining portions of the second dielectric material 129 may be advantageous during the subsequent use of the remaining portions of the second dielectric material 129 as an etch stop material for the subsequent formation of conductive contact structures, as described in further detail below.

Figure 4A:
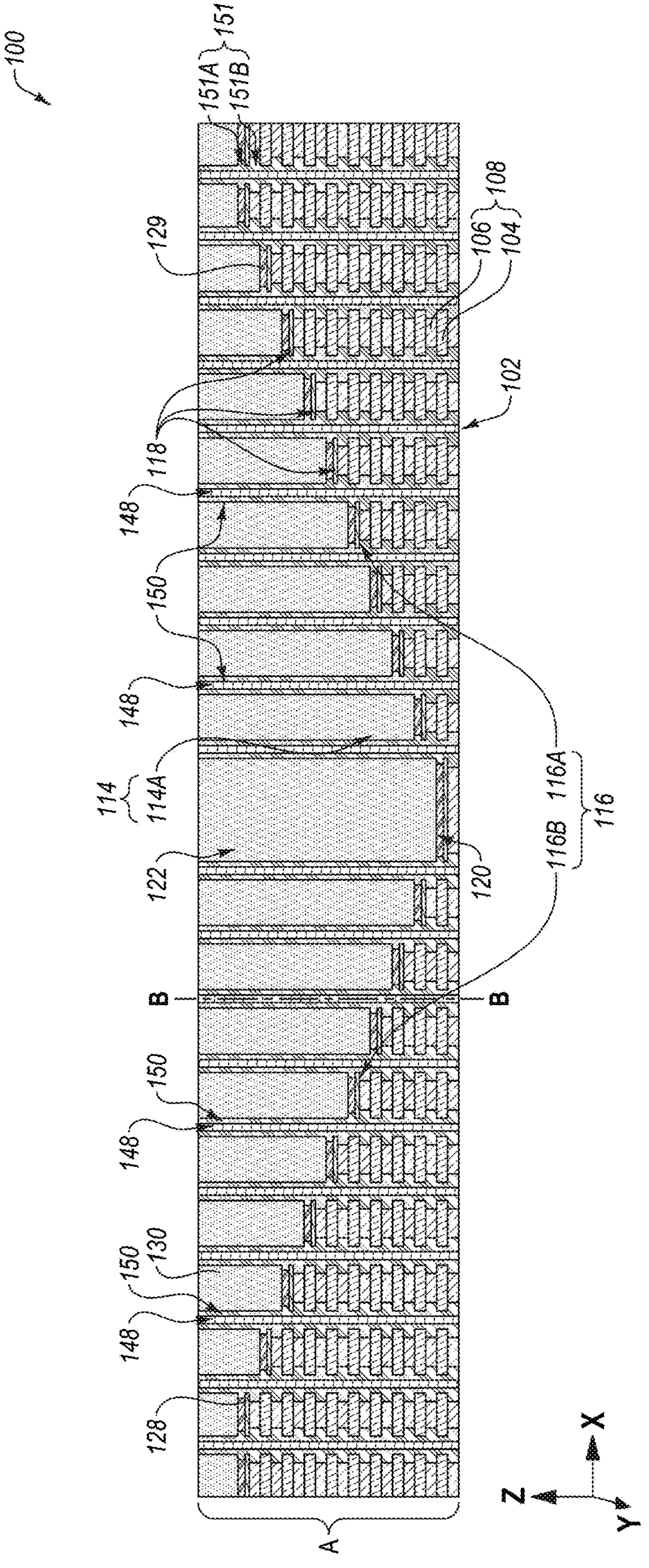
FIG. 4A is a simplified, longitudinal cross-sectional view of the portion A of the microelectronic device structure shown in FIGS. 1 and 2A at another processing stage of the method forming the microelectronic device following the processing stage of FIGS. 3A through 3C.
Figure 4B:
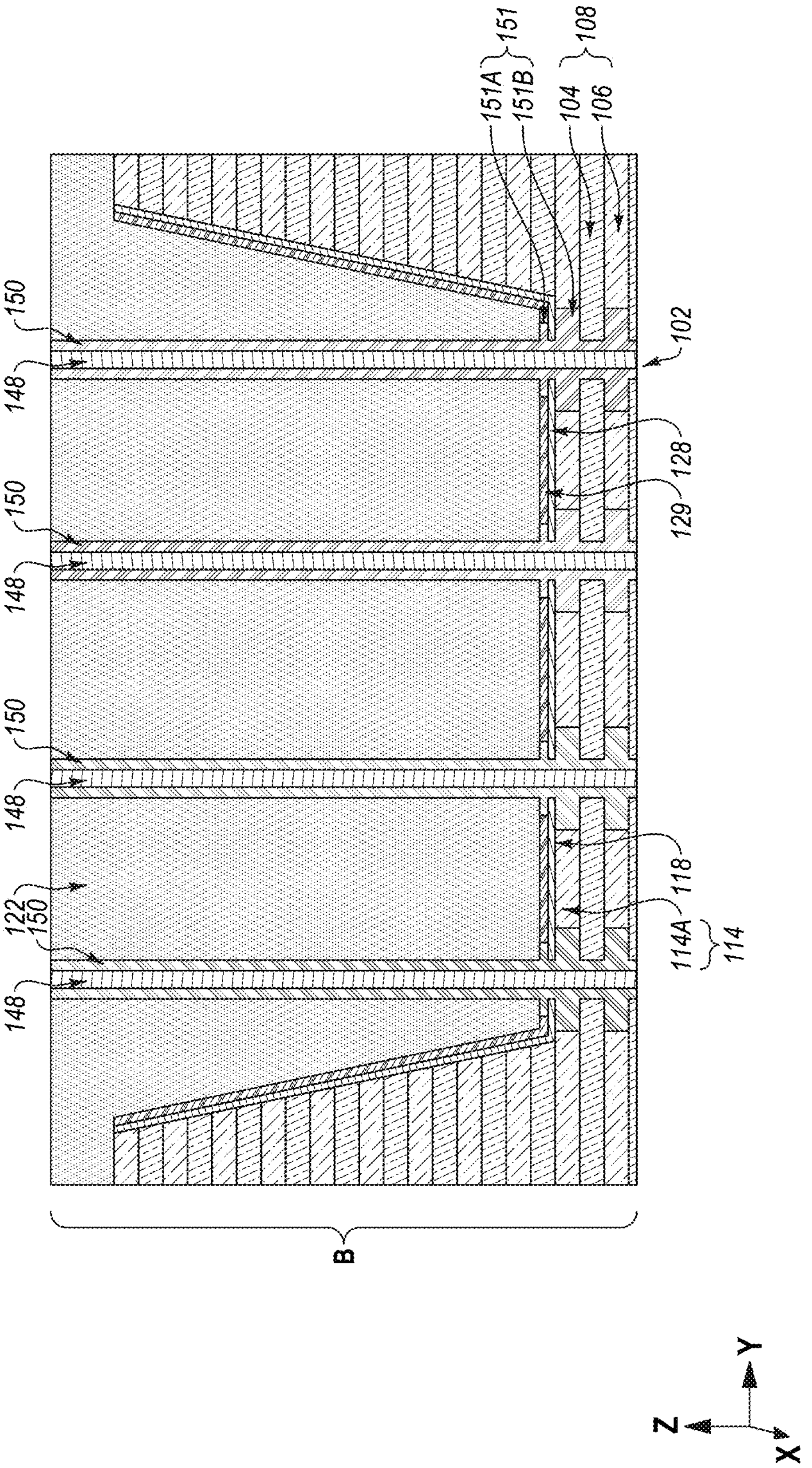
FIG. 4B is a simplified, longitudinal cross-sectional view of a portion of the microelectronic device structure at the processing stage of FIG. 4A about the dashed line B-B shown in FIG. 4A.
Figure 4C:
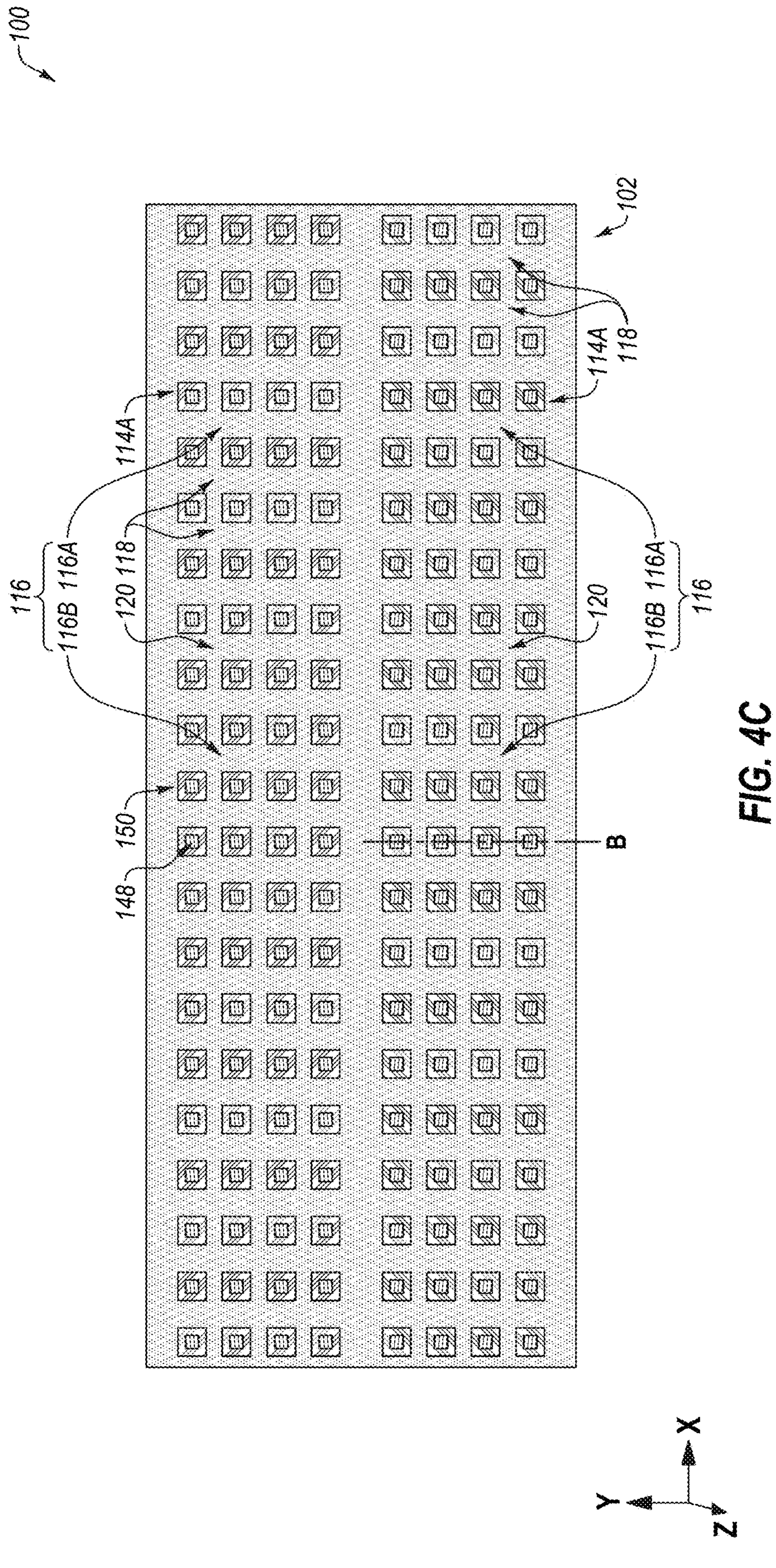
FIG. 4C is a simplified, partial top-down view of the microelectronic device structure at the processing stage of FIG. 4A.

Referring next to FIG. 4A, which is a simplified, longitudinal cross-sectional view of the portion A of the microelectronic device structure 100 following (e.g., subsequent to) the processing stage previously described with reference to FIGS. 3A through 3C, support structures 148 and liner structures 150 the may be formed within the first openings 154 (FIGS. 3A and 3B). The liner structures 150 may be formed to substantially surround (e.g., substantially horizontally and vertically cover) sidewalls the support structures 148. The liner structures 150 may be horizontally interposed between each of the support structures 148 and the tiers 108 (including the sacrificial material 106 and the insulative material 104 thereof) of the preliminary stack structure 102. The support structures 148 and the liner structures 150 may together substantially fill the first openings 154 (FIGS. 3A and 3B). The liner structures 150 may fill the projecting portions 155 (including the first projecting portions 155A and the second projecting portions 155B) (FIGS. 3A and 3B) of the first openings 154 (FIGS. 3A and 3B), and may substantially cover side surfaces of the filled trenches 122 (including the third dielectric material 130, the second dielectric material 129, and the first dielectric material 128 thereof) the preliminary stack structure 102 defining boundaries of the first openings 154. The support structures 148 may fill remaining portions (e.g., central portions) of the first openings 154 (FIGS. 3A and 3B) not occupied by the liner structures FIG. 4B is a simplified, partial longitudinal cross-sectional view of a portion of the microelectronic device structure at the processing stage of FIG. 4A about a dashed line B-B shown in FIG. 4A. FIG. 4C is a simplified, partial top-down view of the microelectronic device structure 100 at the processing stage of FIG. 4A.

A distribution of the support structures 148 and liner structures 150 within the preliminary stack structure 102 may correspond to a distribution of the first openings 154 (FIGS. 3A and 3B) formed within the preliminary stack structure 102. The distribution of the support structures 148 and liner structures 150 may be selected to facilitate support of the insulative material 104 of each of the tiers 108 of the preliminary stack structure 102 during replacement of the sacrificial material 106 of each of the tiers 108 with conductive structures 134, as described in further detail below.

As shown in FIG. 4C, in some embodiments, at least one array of the support structures 148 (and, hence, at least one array of the liner structures 150) may be formed within the preliminary stack structure 102. The array of the support structures 148 may include rows of the support structures 148 and liner structures 150 extending in the X-direction, and columns of the support structures 148 and liner structures 150 extending to the Y-direction. As a non-limiting example, the array of the support structures 148 may include at least two (2) rows (e.g., at least four (4) rows) of the support structures 148 each extending in the X-direction. In some embodiments, the preliminary stack structure 102 includes at least one array of the support structures 148 exhibiting at least four (4) rows of the support structures 148. Portions of the array of the support structures 148 may be located within horizontal areas of the stadium structures 114 within the preliminary stack structure 102.

The support structures 148 may each individually be formed to exhibit a desired horizontal cross-sectional shape. In some embodiments, each of the support structures 148 may be formed to exhibit a substantially circular horizontal cross-sectional shape. In additional embodiments, one or more (e.g., each) of the support structures 148 exhibits a non-circular cross-sectional shape, such as one of more of a square cross-sectional shape, a rectangular cross-sectional shape, an oblong cross-sectional shape, an elliptical cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the support structures 148 may be formed to exhibit substantially the same horizontal cross-sectional dimensions (e.g., substantially the same horizontal diameter), or at least one of the support structures 148 may be formed to exhibit one or more different horizontal cross-sectional dimensions (e.g., a different horizontal diameter) than at least one other of the support structures 148. In some embodiments, all of the support structures 148 are formed to exhibit substantially the same horizontal cross-sectional dimensions.

The support structures 148 may each individually be formed of and include at least one conductive material, such as one or more of at least one metal (e.g., W, Ti, Mo, Nb, V, Hf, Ta, Cr, Zr, Fe, Ru, Os, Co, Rh, Ir, Ni, Pd, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In some embodiments, the support structures 148 are individually formed of and include W. In additional embodiments, one or more of the support structures 148 are formed of and include one or more of an insulative material and a semiconductive material.

The liner structures 150 may each individually be formed to exhibit a desired horizontal cross-sectional shape surrounding the support structures 148. As shown in FIGS. 4A and 4B, individual liner structures 150 include projections 151 substantially filling the projecting portions 155 (FIGS. 3A and 3B) of first openings 154 (FIGS. 3A and 3B). The projections 151 may include first projections 151A filling the first projecting portions 155A (FIGS. 3A and 3B) of the first openings 154 (FIGS. 3A and 3B); and second projections 151B filling the second projecting portions 155B (FIGS. 3A and 3B) of the first openings 154 (FIGS. 3A and 3B). The first projections 151A of the liner structures 150 may exhibit relatively smaller horizontal dimensions (e.g., in the X-direction, in the Y-direction) than the second projections 151B of the liner structures 150. In addition, the first projections 151A of the liner structures 150 may exhibit relatively smaller vertical dimensions (e.g., in the Z-direction) than the second projections 151B of the liner structures 150.

The liner structures 150 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner structures 150 comprise $SiO_2$.

Figure 5A:
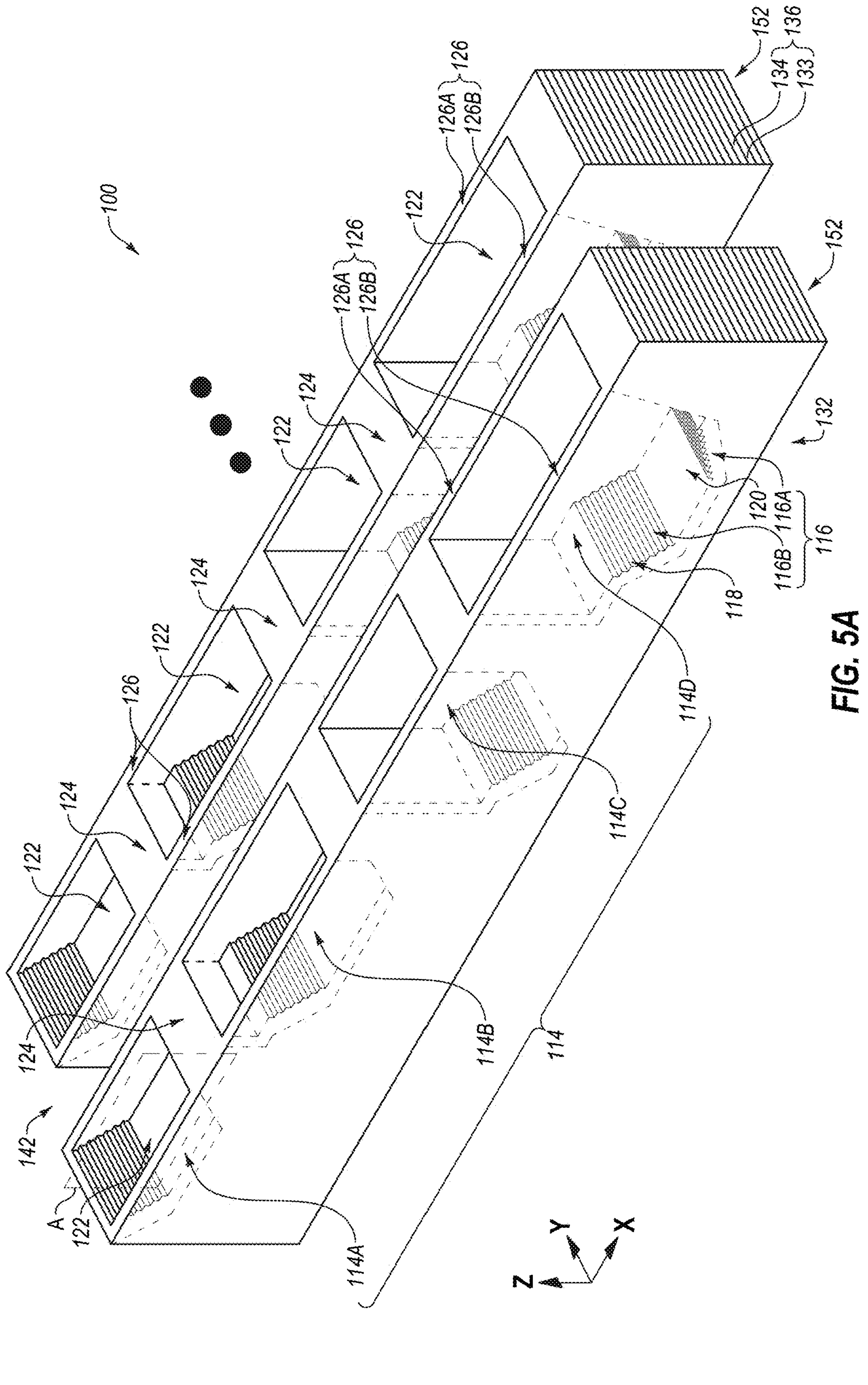
FIG. 5A is a simplified, partial perspective view of the microelectronic device structure shown in FIG. 1 at another processing stage of the method forming the microelectronic device following the processing stage of FIGS. 4A through 4C.
Figure 5B:
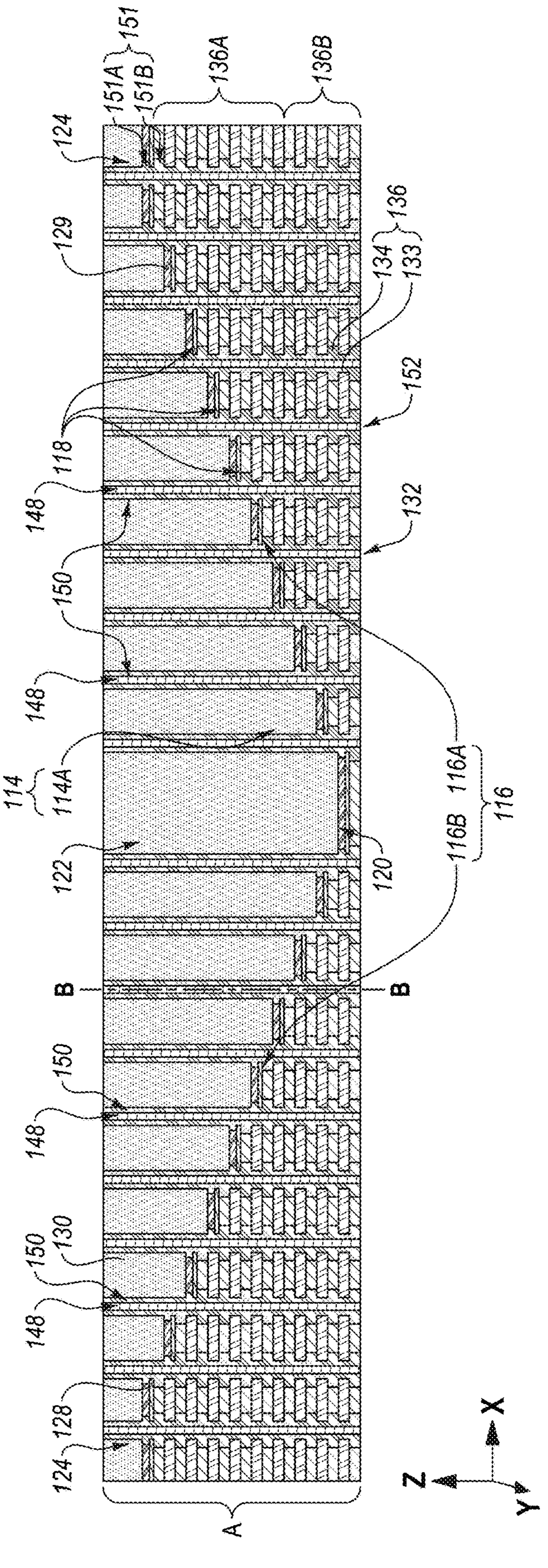
FIG. 5B is a simplified, longitudinal cross-sectional view of the portion A of the microelectronic device structure at the processing stage of FIG. 5A.
Figure 5C:
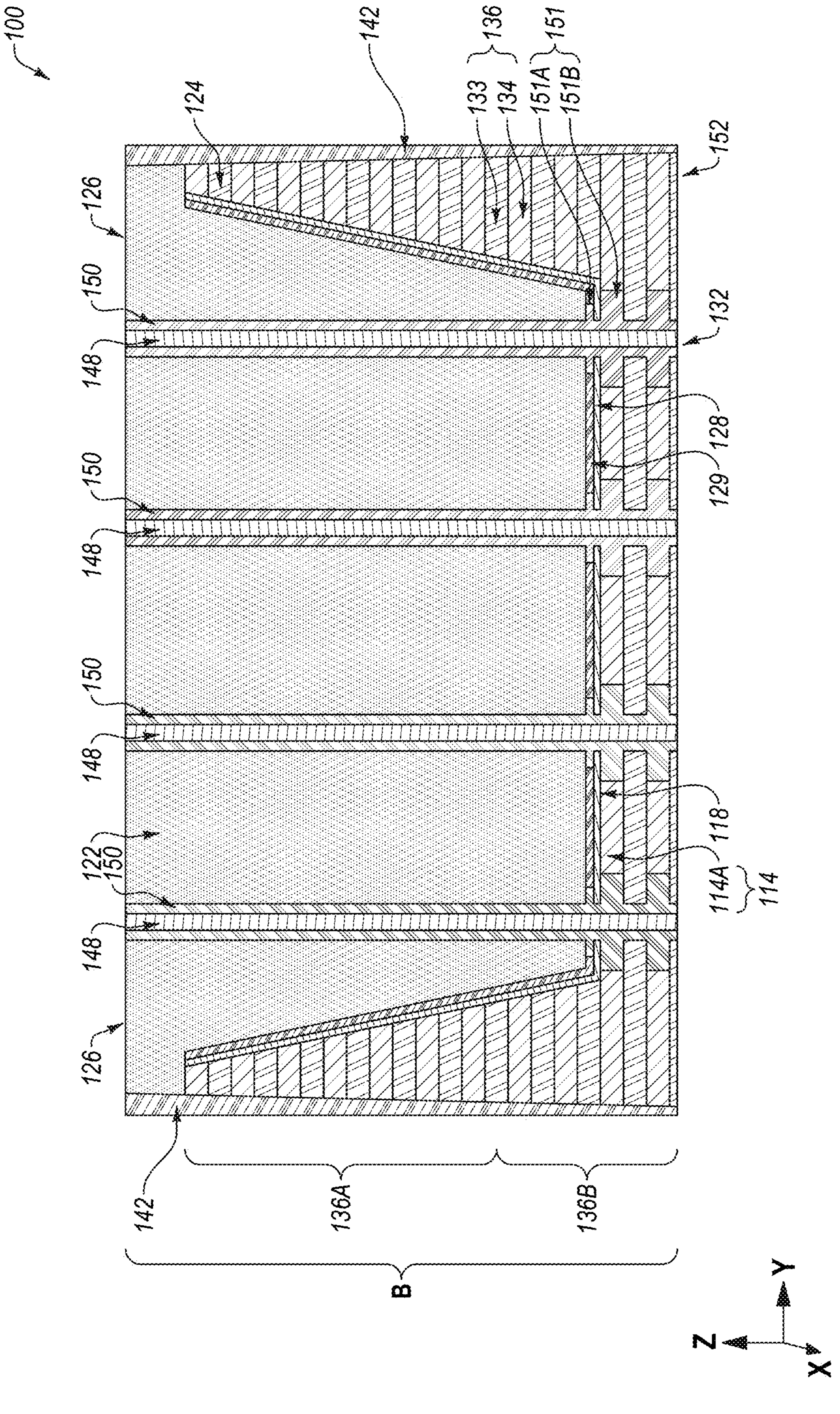
FIG. 5C is a simplified, longitudinal cross sectional view of a portion of the microelectronic device structure at the processing stage of FIG. 5A about the dashed line B-B shown in FIG. 5B.
Figure 5D:
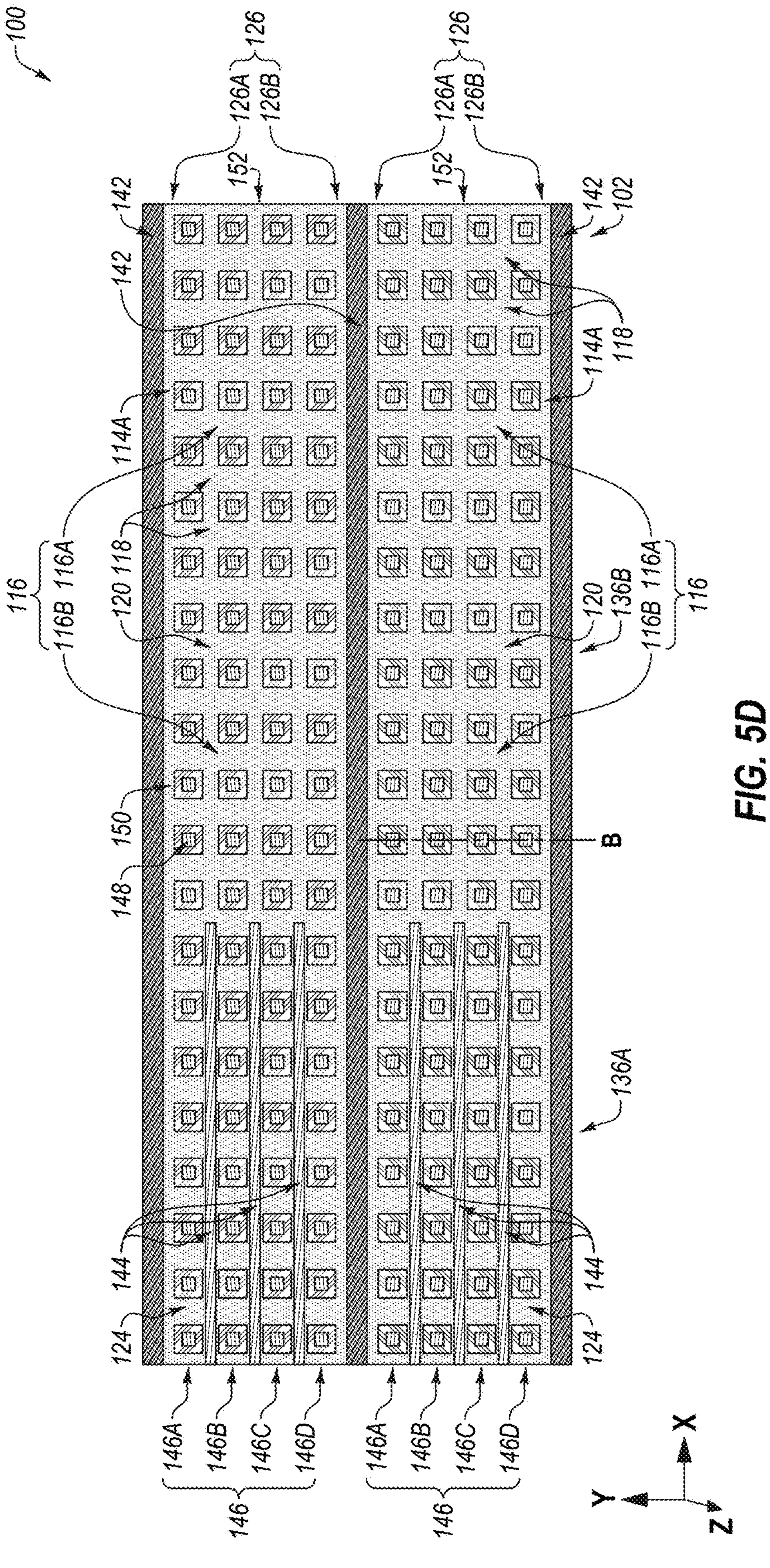
FIG. 5D is a simplified, partial top-down view of the microelectronic device structure at the processing stage of FIG. 5A.

Next, referring to FIG. 5A, which is a simplified, partial perspective view of a microelectronic device structure 100 following (e.g., subsequent to) the processing stage previously described with reference to FIGS. 4A through 4C, the microelectronic device structure 100 the preliminary stack structure 102 (FIGS. 4A through 4C) may be partitioned (e.g., divided, segmented) and subject to replacement gate processing to form a stack structure 132. The stack structure 132 may be divided into blocks 152 separated from one another by slot structures 142. The slot structures 142 may vertically extend (e.g., in the Z-direction) completely through the stack structure 132. Additional features (e.g., materials, structures) of the stack structure 132 (including the blocks 152 thereof) are described in further detail below. In FIG. 5A, for clarity and case of understanding the drawings and associated description, the slot structures 142 are depicted as transparent to more clearly show features of the blocks 152. FIG. 5B is a simplified, longitudinal cross-sectional view of the portion A of the microelectronic device structure 100 at the processing stage depicted in FIG. 5A. FIG. 5C is a simplified, longitudinal cross sectional view of a portion of the microelectronic device structure 100 at the processing stage of FIG. 5A about the dashed line B-B shown in FIG. 5B. FIG. 5D is a simplified, partial top-down view of the microelectronic device structure 100 at the processing stage of FIG. 5A.

As shown in FIG. 5A, the blocks 152 of the stack structure 132 may be formed to horizontally extend parallel in an X-direction. As used herein, the term "parallel" means substantially parallel. Horizontally neighboring blocks 152 of the stack structure 132 may be separated from one another in a Y-direction orthogonal to the X-direction by the slot structures 142. The slot structures 142 may also horizontally extend parallel in the X-direction. Each of the blocks 152 of the stack structure 132 may exhibit substantially the same geometric configuration (e.g., substantially the same dimensions and substantially the same shape) as each other of the blocks 152, or one or more of the blocks 152 may exhibit a different geometric configuration (e.g., one or more different dimensions and/or a different shape) than one or more other of the blocks 152. In addition, each pair of horizontally neighboring blocks 152 of the stack structure 132 may be horizontally separated from one another by substantially the same distance (e.g., corresponding to a width in the Y-direction of each of the slot structures 142) as each other pair of horizontally neighboring blocks 152 of the stack structure 132, or at least one pair of horizontally neighboring blocks 152 of the stack structure 132 may be horizontally separated from one another by a different distance than that separating at least one other pair of horizontally neighboring blocks 152 of the stack structure 132. In some embodiments, the blocks 152 of the stack structure 132 are substantially uniformly (e.g., substantially non-variably, substantially equally, substantially consistently) sized, shaped, and spaced relative to one another.

Each of the blocks 152 of the stack structure 132 may be formed to include a vertically alternating (e.g., in a Z-direction) sequence of insulative structures 133 and conductive structures 134 arranged in tiers 136. Within an individual block 152 of the stack structure 132, each of the tiers 136 may individually include one of the conductive structures 134 vertically neighboring (e.g., directly vertically adjacent) one of the insulative structures 133. The insulative structures 133 of the blocks 152 of the stack structure 132 may comprise portions of the insulative material 104 (FIGS. 4A and 4B) of the preliminary stack structure 102 (FIGS. 4A and 4B) remaining following the formation of the blocks 152. The conductive structures 134 of the blocks 152 of the stack structure 132 may comprise at least one conductive material formed (e.g., deposited) in place of the sacrificial material 106 (FIGS. 4A and 4B) of the tiers preliminary stack structure 102 (FIGS. 4A and 4B) through the replacement gate process, as described in further detail below. The conductive material may formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive structures 134 are formed of and includes W. Optionally, at least one liner material (e.g., at least one insulative liner material, at least one conductive liner materials) may be formed around the conductive structures 134. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive structures 134. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the block 152 of the stack structure 132, $AlO_x$ (e.g., $Al_2O_3$) may be formed directly adjacent the insulative structures 133, $TiN_x$ (e.g., TiN) may be formed directly adjacent the $AlO_x$, and W may be formed directly adjacent the $TiN_x$. For clarity and case of understanding the description, the liner material is not illustrated in FIGS. 4A-4C, but it will be understood that the liner material may be disposed around the conductive structures 134.

Referring to FIG. 5B, within each block 152 of the stack structure 132, the conductive structures 134 of one or more relatively vertically higher tier(s) 136A (e.g., upper tiers) may be employed to form upper select gate structures (e.g., drain side select gate (SGD) structures) for upper select transistors (e.g., drain side select transistors) of the block 152, as described in further detail below. The conductive structures 134 of the relatively vertically higher tier(s) 136A may be segmented by one or more filled slot(s) (e.g., filled SGD slot(s)) to form the upper select gate structures of the block 152, as also described in further detail below. In some embodiments, within each block 152 of the stack structure 132, the conductive structures 134 of each of less than or equal to eight (8) relatively vertically higher tier(s) 136A (e.g., from one (1) relatively vertically higher tier 136A to eight (8) relatively vertically higher tiers 136A) of the stack structure 132 may be employed to form upper select gate structures (e.g., SGD structures) for the block 152. In addition, within each block 152 of the stack structure 132, the conductive structures 134 of at least some relatively vertically lower tiers 136B vertically underlying the relatively vertically higher tier(s) 136A may be employed to form access line structures (e.g., word line structures) of the block 152, as also described in further detail below. Moreover, within each block 152 of the stack structure 132, the conductive structures 134 of at least a relatively vertically lowest tier 136B may be employed to form as at least one lower select gate structure (e.g., at least one source side select gate (SGS) structure) for lower select transistors (e.g., source side select transistors) of the block 152, as also described in further detail below.

To form the stack structure 132, including the blocks 152 thereof, slots (e.g., trenches, openings, apertures) having geometric configurations (e.g., shapes, dimensions) and positions corresponding to (e.g., substantially the same as) having geometric configurations (e.g., shapes, dimensions) and positions of the slot structures 142 may be formed in the preliminary stack structure 102 (FIGS. 4A and 4B). Thereafter, the microelectronic device structure 100 may be treated with at least one wet etchant formulated to selectively remove portions of the sacrificial material 106 (FIGS. 4A and 4B) of the tiers 108 (FIGS. 4A and 4B) of the preliminary stack structure 102 (FIGS. 4A and 4B) through the slots. The wet etchant may be selected to remove the portions of the sacrificial material 106 (FIGS. 4A and 4B) without substantially removing portions of the insulative material 104 (FIGS. 4A and 4B) of the tiers 108 (FIGS. 4A and 4B) of the preliminary stack structure 102 (FIGS. 4A and 4B), and without substantially removing portions of the first dielectric material 128. During the material removal process, the first dielectric material 128 may protect (e.g., mask) the second dielectric material 129 and the third dielectric material 130 of the filled trenches 122 from being removed. In some embodiments wherein the sacrificial material 106 (FIGS. 4A and 4B) comprises a dielectric nitride material (e.g., $SiN_y$, such as $Si_3N_4$) and the insulative material 104 and the first dielectric material 128 comprise a dielectric oxide material (e.g., $SiO_x$, such as $SiO_2$), the sacrificial material 106 (FIGS. 4A and 4B) of the tiers 108 (FIGS. 4A and 4B) of the preliminary stack structure 102 (FIGS. 4A and 4B) is selectively removed using a wet etchant comprising $H_3PO_4$. Following the selective removal of the portions of the sacrificial material 106 (FIGS. 4A and 4B), the resulting recesses may be filled with conductive material to form the conductive structures 134 of the blocks 152 of the stack structure 132. In addition, following the formation of the blocks 152, the slots between the blocks 152 may be filled (e.g., substantially filled) with at least one dielectric material (e.g., at least one dielectric oxide material, such as $SiO_x$; at least one dielectric nitride material, such as $SiN_y$) to form the slot structures 142. In some embodiments, the slot structures 142 are formed of and include $SiO_2$. The slot structures 142 may individually be formed to be substantially homogeneous, or may individually be formed to be heterogeneous.

Referring again to FIG. 5A, each block 152 of the stack structure 132 may individually be formed to include a row of the stadium structures 114 (e.g., including the first stadium structure 114A, the second stadium structure 114B, the third stadium structure 114C, and the fourth stadium structure 114D of the row), crest regions 124 (e.g., elevated regions), and bridge regions 126 (e.g., additional elevated regions). The stadium structures 114 may be distributed throughout and substantially confined within a horizontal area of the block 152. The crest regions 124 may be horizontally interposed between stadium structures 114 horizontally neighboring one another in the X-direction. The bridge regions 126 may horizontally neighbor opposing sides of individual stadium structures 114 in the Y-direction, and may horizontally extend from and between crest regions 124 horizontally neighboring one another in the X-direction. In FIG. 5A, for clarity and case of understanding the drawings and associated description, portions (e.g., some of the bridge regions 126 horizontally neighboring first sides of the stadium structures 114 in the Y-direction) of one of the blocks 152 of the stack structure 132 are depicted as transparent to more clearly show the stadium structures 114 distributed within the block 152.

As shown in FIG. 5A, the crest regions 124 of an individual block 152 of the stack structure 132 may intervene between and separate stadium structures 114 horizontally neighboring one another in the X-direction. For example, one of the crest regions 124 may intervene between and separate the first stadium structure 114A and the second stadium structure 114B; an additional one of the crest regions 124 may intervene between and separate the second stadium structure 114B and the third stadium structure 114C; and a further one of the crest regions 124 may intervene between and separate the third stadium structure 114C and the fourth stadium structure 114D. A vertical height of the crest regions 124 in the Z-direction may be substantially equal to a maximum vertical height of the block 152 in the Z-direction; and a horizontal width of the crest regions 124 in the Y-direction may be substantially equal to a maximum horizontal width of the block 152 in the Y-direction. In addition, each of the crest regions 124 may individually exhibit a desired horizontal length in the X-direction. Each of the crest regions 124 of an individual block 152 of the stack structure 132 may exhibit substantially the same horizontal length in the X-direction as each other of the crest regions 124 of the block 152; or at least one of the crest regions 124 of the block 152 may exhibit a different horizontal length in the X-direction than at least one other of the crest regions 124 of the block 152.

Still referring to FIG. 5A, the bridge regions 126 of an individual block 152 of the stack structure 132 may be formed to intervene between and separate the stadium structures 114 of the block 152 from the slot structures 142 horizontally neighboring the block 152 in the Y-direction. For example, for each stadium structure 114 within an individual block 152 of the stack structure 132, a first bridge region 126A may be horizontally interposed in the Y-direction between a first side of the stadium structure 114 and a first of the slot structures 142 horizontally neighboring the block 152; and a second bridge region 126B may be horizontally interposed in the Y-direction between a second side of the stadium structure 114 and a second of the slot structures 142 horizontally neighboring the block 152. The first bridge region 126A and the second bridge region 126B may horizontally extend in parallel in the X-direction. In addition, the first bridge region 126A and the second bridge region 126B and may each horizontally extend from and between crest regions 124 of the block 152 horizontally neighboring one another in the X-direction. The bridge regions 126 of the block 152 may be integral and continuous with the crest regions 124 of the block 152. Upper boundaries (e.g., upper surfaces) of the bridge regions 126 may be substantially coplanar with upper boundaries of the crest regions 124. A vertical height of the bridge regions 126 in the Z-direction may be substantially equal to a maximum vertical height of the block 152 in the Z-direction. In addition, each of the bridge regions 126 (including each first bridge region 126A and each second bridge region 126B) may individually exhibit a desired horizontal width in the Y-direction and a desired horizontal length in the X-direction. Each of the bridge regions 126 of the block 152 may exhibit substantially the same horizontal length in the X-direction as each other of the bridge regions 126 of the block 152; or at least one of the bridge regions 126 of the block 152 may exhibit a different horizontal length in the X-direction than at least one other of the bridge regions 126 of the block 152. In addition, each of the bridge regions 126 of the block 152 may exhibit substantially the same horizontal width in the Y-direction as each other of the bridge regions 126 of the block 152; or at least one of the bridge regions 126 of the block 152 may exhibit a different horizontal width in the Y-direction than at least one other of the bridge regions 126 of the block 152.

For each block 152 of the stack structure 132, the bridge regions 126 thereof horizontally extend around the filled trenches 122 of the block 152. Some of the bridge regions 126 of the block 152 may be employed to form continuous conductive paths extending from and between horizontally neighboring crest regions 124 of the block 152. The first dielectric material 128 (FIG. 5B) of the filled trenches 122 may be positioned directly horizontally adjacent (e.g., in the Y-direction) inner side surfaces (e.g., inner sidewalls) of the bridge regions 126, and the slot structures 142 (FIGS. 5A and 5D) may be positioned directly horizontally adjacent (e.g., in the Y-direction) outer side surfaces (e.g., outer sidewalls) of the bridge regions 126.

Referring to FIG. 5C, inner horizontal boundaries (e.g., inner sidewalls) of each of the bridge regions 126 (e.g., each of the first bridge regions 126A, each of the second bridge regions 126B) of each block 152 of the stack structure 132 may be oriented substantially non-perpendicular to uppermost vertical boundaries (e.g., uppermost surfaces) of the block 152. For example, the inner horizontal boundaries of the first bridge regions 126A of an individual block 152 may exhibit negative slope, and the inner horizontal boundaries of the second bridge regions 126B of the block 152 may exhibit positive slope. Horizontal widths in the Y-direction of each bridge region 126 (e.g., a first bridge region 126A and a second bridge region 126B) of a pair of bridge regions 126 horizontally neighboring an individual stadium structure 114 (e.g., a first stadium structure 114A) of the block 152 in the Y-direction may increase in the downward Z-direction (e.g., negative Z-direction) from an uppermost vertical boundary of the stadium structure 114 to a lowermost vertical boundary of the stadium structure 114. Accordingly, relatively vertically lower steps 118 of the stadium structure 114 may have relatively smaller (e.g., narrower) horizontal widths in the Y-direction than relatively vertically higher steps 118 of the stadium structure 114.

The first dielectric material 128 may substantially cover and continuously extend across the inner horizontal boundaries (e.g., inner sidewalls, inner side surfaces) of each of the bridge regions 126 (e.g., each of the first bridge regions 126A, each of the second bridge regions 126B) of each block 152 of the stack structure 132. The first dielectric material 128 may also substantially cover and continuously extend across the boundaries (e.g., horizontal boundaries, vertical boundaries) of each stadium structure 114 within each block 152 of the stack structure 132. Furthermore, the second dielectric material 129 may at least partially (e.g., substantially) cover and continuously extend across the first dielectric material 128; and the third dielectric material 130 may substantially cover and continuously extend across the second dielectric material 129.

Referring to FIG. 5D, in addition to the features (e.g., structures, materials) previously described with reference to FIGS. 5A, 5B and 5C, the microelectronic device structure 100 may be formed to further include additional filled slot structures 144. The additional filled slot structures 144 may be formed to vertically extend (e.g., in the Z-direction) partially through each block 152 of the stack structure 132, and may partially define and horizontally separate (e.g., in the Y-direction) regions designed for upper select gate structures of each block 152 of the stack structure 132.

Within each block 152 of the stack structure 132, the additional filled slot structures 144 may be formed to horizontally extend in parallel in the X-direction into a horizontal area of the first stadium structure 114A within the block 152. The additional filled slot structures 144 may, for example, individually horizontally extend in the X-direction through a crest region 124 of the block 152 horizontally neighboring the first stadium structure 114A and partially into a horizontal area of one of the opposing staircases structures 116 (e.g., the reverse staircase structure 116B) of the first stadium structure 114A. In some embodiments, each of the additional filled slot structures 144 horizontally terminates (e.g., horizontally ends) in the X-direction at or proximate a relatively lowest step 118 of the one of the opposing staircase structures 116 (e.g., the reverse staircase structure 116B) within vertical boundaries (e.g., in the Z-direction) of the relatively vertically higher tiers 136A of the stack structure 132. In addition, each of the additional filled slot structures 144 may vertically extend in the Z-direction to and terminate at or within vertical boundaries of a relatively lowest tier 136B of the relatively vertically higher tiers 136A of the stack structure 132. Within the block 152, horizontal ends of the relatively lowest tier 136 of the relatively vertically higher tiers 136A of the stack structure 132 may define the relatively lowest step 118 of the one of the opposing staircase structures 116 (e.g., the reverse staircase structure 116B).

Each additional filled slot structure 144 may comprise a slot (e.g., opening, trench, slit) in a block 152 of the stack structure 132 filled with at least one dielectric material. A material composition of the dielectric material of the additional filled slot structures 144 may be substantially the same as a material composition of the dielectric material of the filled slot structures 142, or the material composition of the dielectric material of the additional filled slot structures 144 may be different than the material composition of the dielectric material of the filled slot structures 142. In some embodiments, the additional filled slot structures 144 are formed of and include at least one dielectric oxide material (e.g., $SiO_x$, such as $SiO_2$).

Each block 152 of the stack structure 132 may include greater than or equal to one (1) of the additional filled slot structures 144 within a horizontal area thereof, such as greater than or equal to two (2) of the additional filled slot structures 144, or greater than or equal to three (3) of the additional filled slot structures 144. In some embodiments, each block 152 of the stack structure 132 includes three (3) of the additional filled slot structures 144 within a horizontal area thereof. The additional filled slot structures 144 may sub-divide each block 152 into at least two (2) sub-blocks 146. For example, as shown in FIG. 5D, if an individual block 152 includes three (3) of the additional filled slot structures 144 within a horizontal area thereof, the additional filled slot structures 144 may sub-divide the block 152 into four (4) sub-blocks 146, such as a first sub-block 146A, a second sub-block 146B, a third sub-block 146C, and a fourth sub-block 146D.

Figure 6A:
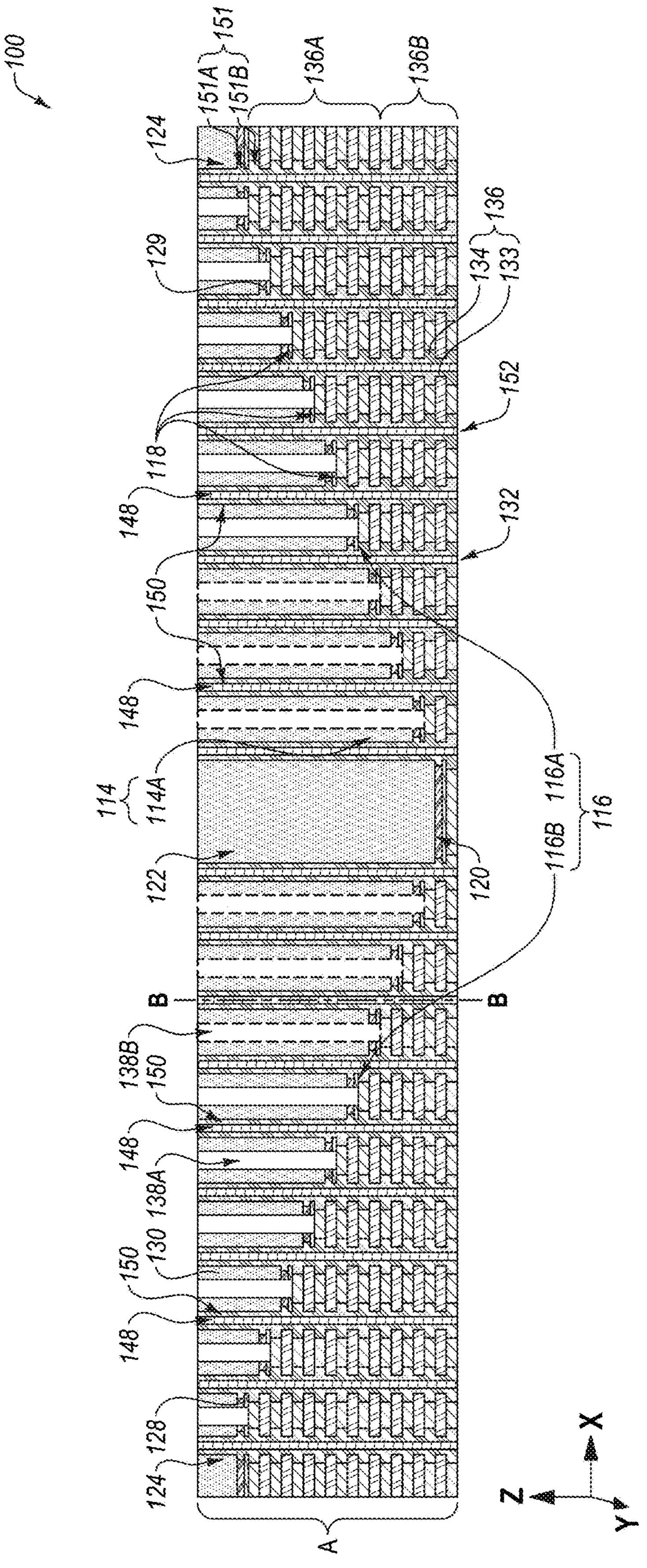
FIG. 6A is a simplified, longitudinal cross-sectional view of the portion A of the microelectronic device structure shown in FIGS. 1 and 2A at another processing stage of the method forming the microelectronic device following the processing stage of FIGS. 5A and 5B.
Figure 6B:
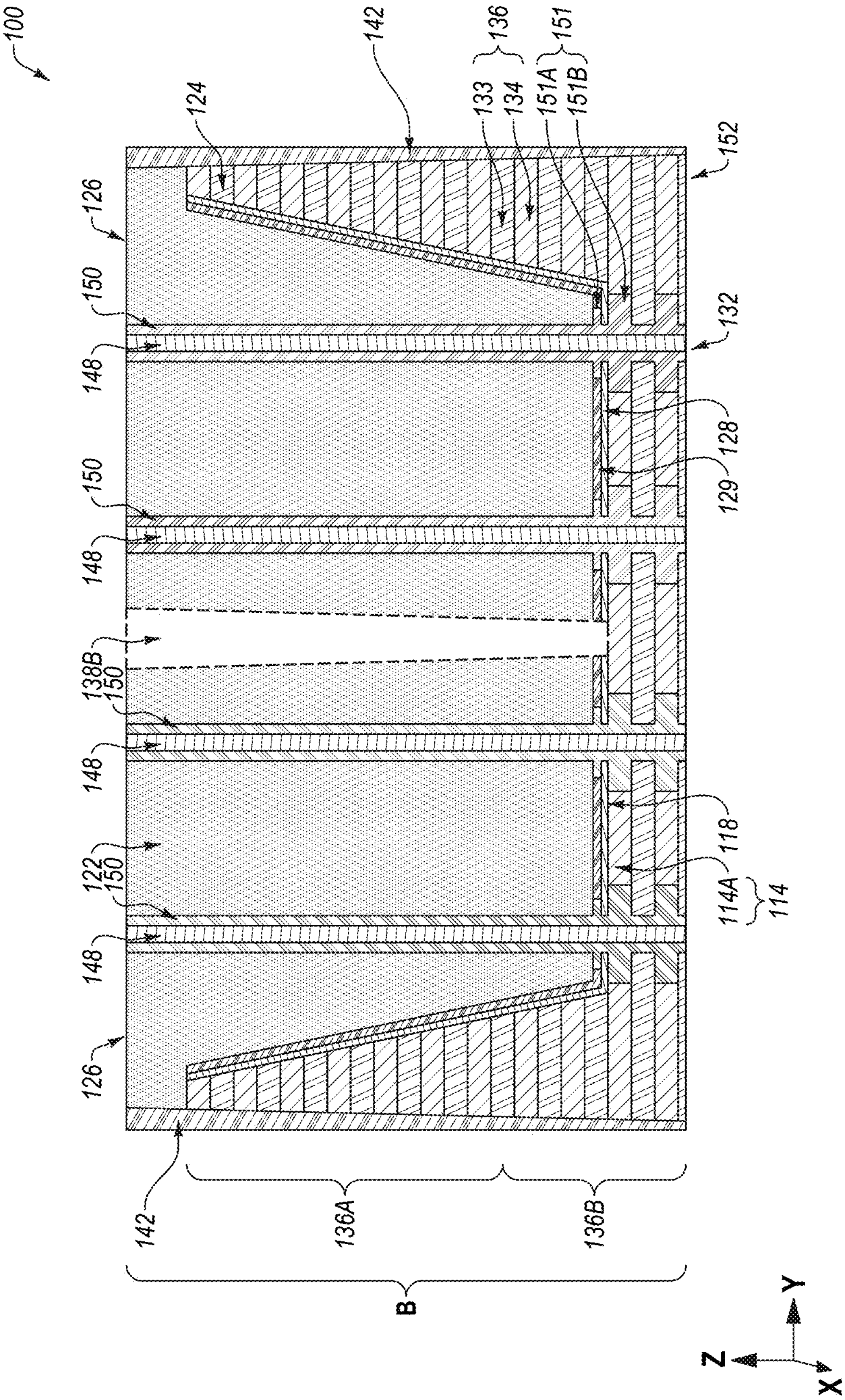
FIG. 6B is a simplified, longitudinal cross-sectional view of a portion of the microelectronic device structure at the processing stage of FIG. 6A about the dashed line B-B shown in FIG. 6A.
Figure 6C:
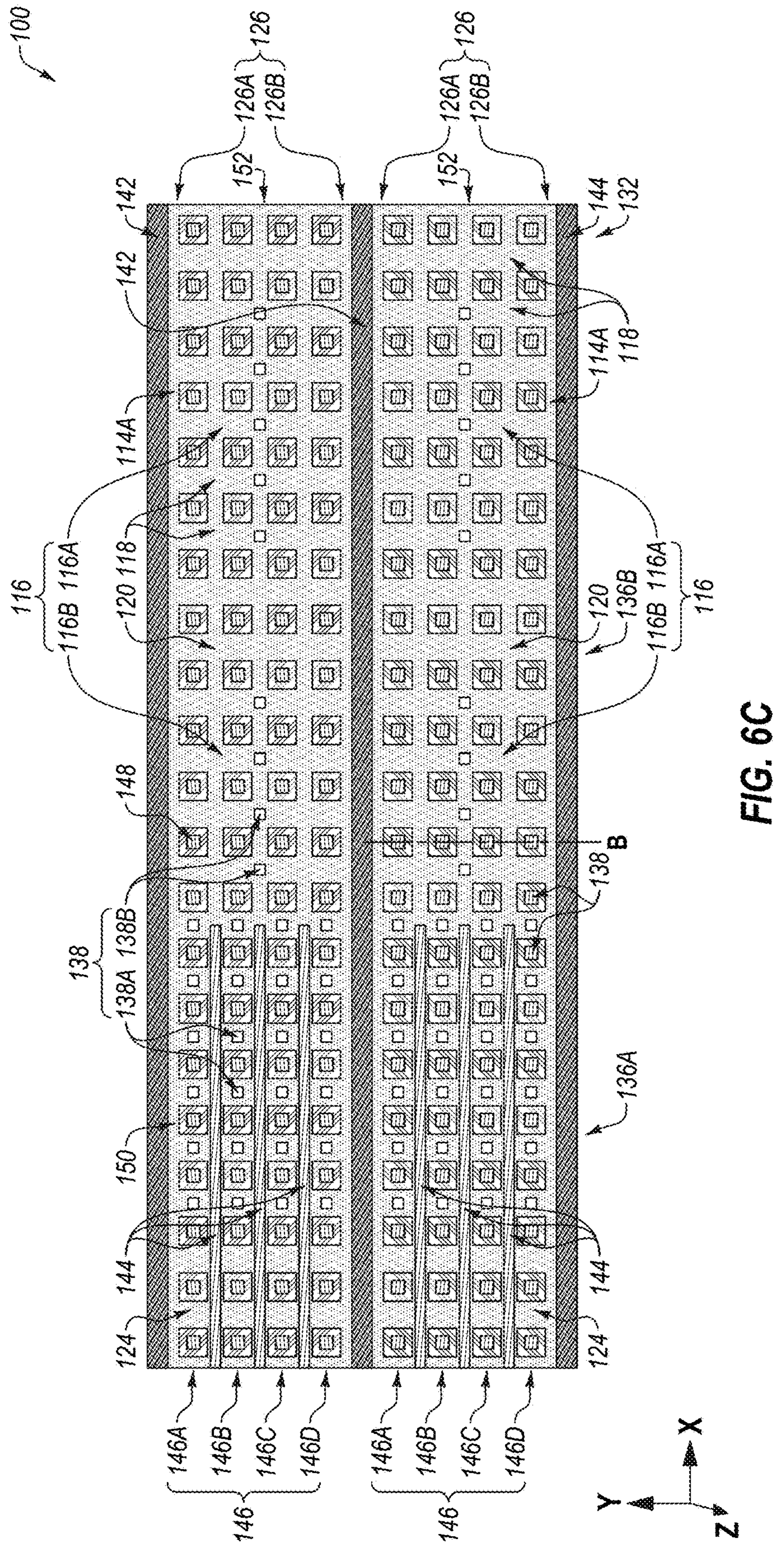
FIG. 6C is a simplified, partial top-down view of the microelectronic device structure at the processing stage of FIG. 6A.

Referring next to FIG. 6A, which is a simplified, longitudinal cross-sectional view of the portion A of the microelectronic device structure 100 following (e.g., subsequent to) the processing stage previously described with reference to FIGS. 5A through 5C, portions of third dielectric material 130, the second dielectric material 129, and the first dielectric material 128 are removed (e.g., etched) to form contact openings 138 (e.g., apertures, vias) vertically extending (e.g., in the Z-direction) therethrough. The contact openings 138 may vertically extend to steps 118 of one or more (e.g., each) of the stadium structures 114, such as steps 118 of the forward staircase structure 116A of one or more of the stadium structures 114 and/or steps 118 of the reverse staircase structure 116B of one or more of the stadium structures 114. A bottom (e.g., lower vertical end) of each contact opening 138 may expose and be defined by an upper surface of the conductive structure 134 of an individual tier 136 of the stack structure 132 at an individual step 118 of an individual stadium structure 114 of an individual block 152 of the stack structure 132. FIG. 6B is a simplified, partial longitudinal cross-sectional view of a portion of the microelectronic device structure at the processing stage of FIG. 6A about a dashed line B-B shown in FIG. 6A. FIG. 6C is a simplified, partial top-down view of the microelectronic device structure 100 at the processing stage of FIG. 6A.

As shown in FIG. 6A, within a horizontal area of the first stadium structure 114A (e.g., a vertically uppermost stadium structure 114) within an individual block 152 of the stack structure 132, the contact openings 138 may include first contact openings 138A and second contact openings 138B. Within horizontal boundaries of the block 152, the first contact openings 138A may vertically extend to and terminate at the relatively vertically higher tier(s) 136A of the stack structure 132, and the second contact openings 138B may vertically extend to and terminate at the relatively vertically lower tiers 136B of the stack structure 132. The first contact openings 138A may vertically extend to and partially expose upper select gate structures (e.g., SGD structures) of the block 152 formed by portions of the conductive structures 134 of individual relatively vertically higher tier(s) 136A of the stack structure 132. The second contact openings 138B may vertically extend to and partially expose access line structures of the block 152 formed by the conductive structures 134 of individual relatively vertically lower tiers 136B of the stack structure 132.

Within each block 152 of the stack structure 132, each contact opening 138 may be formed at desired a horizontal position (e.g., in the X-direction and the Y-direction) on or over one of the steps 118 of one of the stadium structures 114. As described in further detail below with reference to FIG. 6C, within a horizontal area of the first stadium structure 114A, at least some of the second contact openings 138B may be horizontally offset in the Y-direction from at least some of the first contact openings 138A. In FIG. 6A, such horizontal offset is depicted by way of dashed lines at the boundaries (e.g., horizontal boundaries, vertical boundaries) of the second contact openings 138B. In addition, individual steps 118 of the first stadium structure 114A (e.g., individual steps 118 of the forward staircase structure 116A thereof, individual steps 118 of the reverse staircase structure 116B thereof) may have a single (e.g., only one) contact opening 138 vertically extending thereto, may have multiple (e.g., more than one) contact openings 138 vertically extending thereto, or may have no contact openings 138 vertically extending thereto.

The contact openings 138 may each individually be formed to exhibit a desired horizontal cross-sectional shape. In some embodiments, each of the contact openings 138 may be formed to exhibit a substantially circular horizontal cross-sectional shape. In additional embodiments, one or more (e.g., each) of the contact openings 138 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the contact openings 138 may be formed to exhibit substantially the same horizontal cross-sectional dimensions (e.g., substantially the same horizontal diameter), or at least one of the contact openings 138 may be formed to exhibit one or more different horizontal cross-sectional dimensions (e.g., a different horizontal diameter) than at least one other of the contact openings 138. In some embodiments, all of the contact openings 138 are formed to exhibit substantially the same horizontal cross-sectional dimensions.

The contact openings 138 may be formed using multiple material removal acts. For example, portions of the third dielectric material 130 may be removed using a first material removal act (e.g., a first etching process) to form preliminary contact openings vertically extending to and exposing portions of the second dielectric material 129; and then portions of the second dielectric material 129 and the first dielectric material 128 within horizontal boundaries of the preliminary contact openings may be removed using a second material removal act (e.g., a second etching process) to vertically extend the preliminary contact openings to the steps 118 of the stadium structures 114 and form the contact openings 138. As a non-limiting example, the first material removal act may comprise a first etching process (e.g., anisotropic dry etching, such as one or more of RIE, deep RIE, plasma etching, reactive ion beam etching, and chemically assisted ion beam etching); and the second material removal act may comprise a second, different etching process (e.g., a so-called "punch through" etch). During the first etching process, the second dielectric material 129 may serve as a so-called "etch stop" material to protect underlying portions of the first dielectric material 128 and the stack structure 132 from removal.

As shown in FIG. 6B, since the first projections 151A of the liner structures 150 are formed to be relatively smaller than the second projections 151B of the liner structures 150 (due to the relatively slower etch rate of the second dielectric material 129 as compared to the sacrificial material 106 (FIGS. 4A and 4B)), remaining portions of the second dielectric material 129 may effectively serve as relatively larger etch stop structures for the preliminary contact openings than may otherwise be achieved if the second dielectric material 129 did not have the configuration of the disclosure. The relatively larger horizontal size of the remaining portions of the second dielectric material 129 permits lower ends of the contact openings 138 to have relatively smaller horizontal dimensions (e.g., in the Y-direction) than portions of the conductive structures 134 horizontally interposed between the liner structures 150 and exposed by the contact openings 138. Namely, further remaining portions of the second dielectric material 129 may be horizontally interposed between lower ends of the contact openings 138 and the first projections 151A of the liner structures 150. Horizontal areas of the lower ends of the contact openings 138 may be completely confined within horizontal areas of the portions of the conductive structures 134 horizontally interposed between the liner structures 150, and the contact openings 138 may terminate at upper surface of the conductive structures 134 exposed thereby. Namely, as a result of the second dielectric material 129 (and, hence, the first projections 151A of the liner structures 150), no portion of an individual contact opening 138 may vertically extend past an individual conductive structure 134 exposed thereby.

Accordingly, the second dielectric material 129 (and, hence, the first projections 151A of the liner structures 150) of the disclosure may substantially prevent undesirable shorting between neighboring conductive structures 134 of the stack structure 132 that may otherwise occur after the contact openings 138 are subsequently filled with conductive material (as described in further detail below).

As shown in FIG. 6A, within a horizontal area of the first stadium structure 114A (e.g., a vertically uppermost stadium structure 114) within horizontal boundaries of an individual block 152, the second contact openings 138B may vertically extend to and terminate at the relatively vertically lower tier(s) 136B of the stack structure 132, and the second contact openings 138B may individually be positioned horizontally between support structures 148 (and liner structures 150) horizontally neighboring one another in the X-direction. In addition, as shown in FIG. 6B, some of the contact openings 138 (e.g., the second contact openings 138B) may also individually positioned horizontally between support structures 148 (and liner structures 150) horizontally neighboring one another in the Y-direction.

Figure 7A:
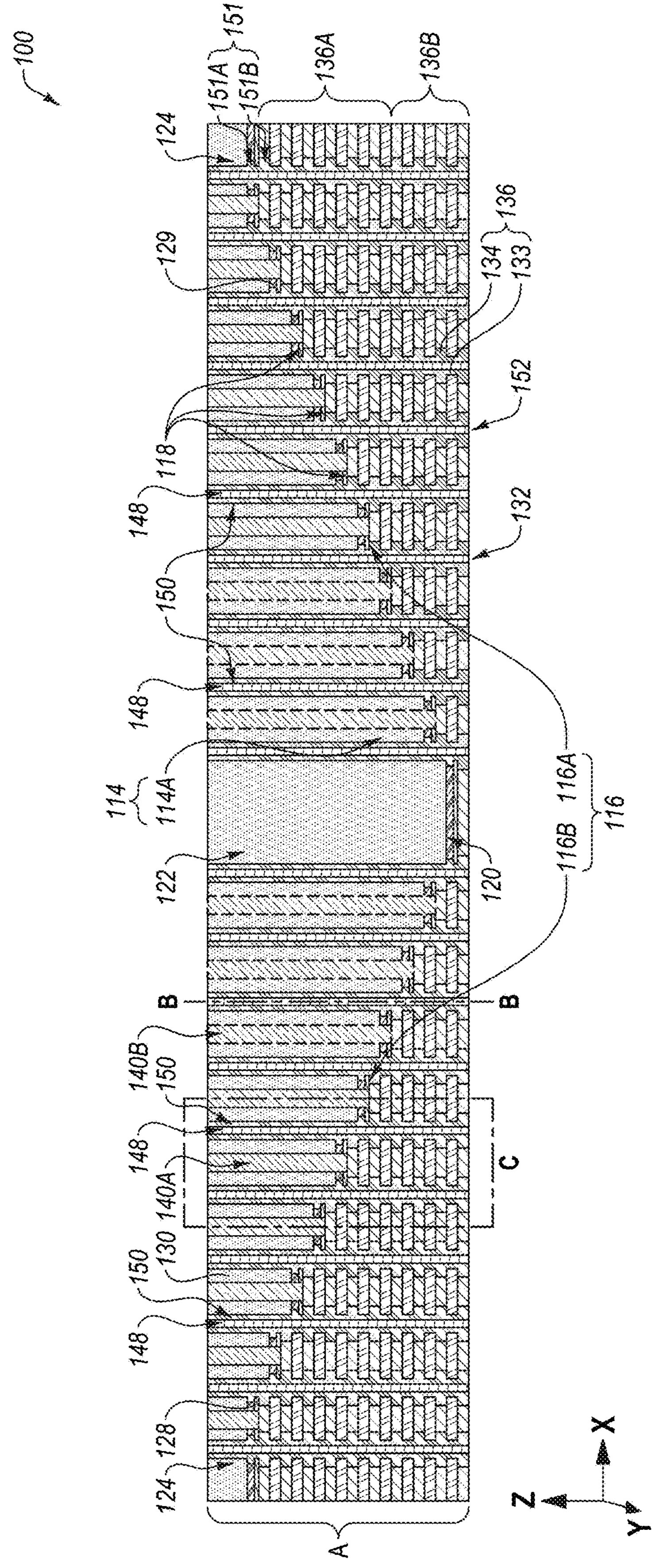
FIG. 7A is a simplified, longitudinal cross-sectional view of the portion A of the microelectronic device structure shown in FIGS. 1 and 2A at another processing stage of the method forming the microelectronic device following the processing stage of FIGS. 6A through 6C.
Figure 7B:
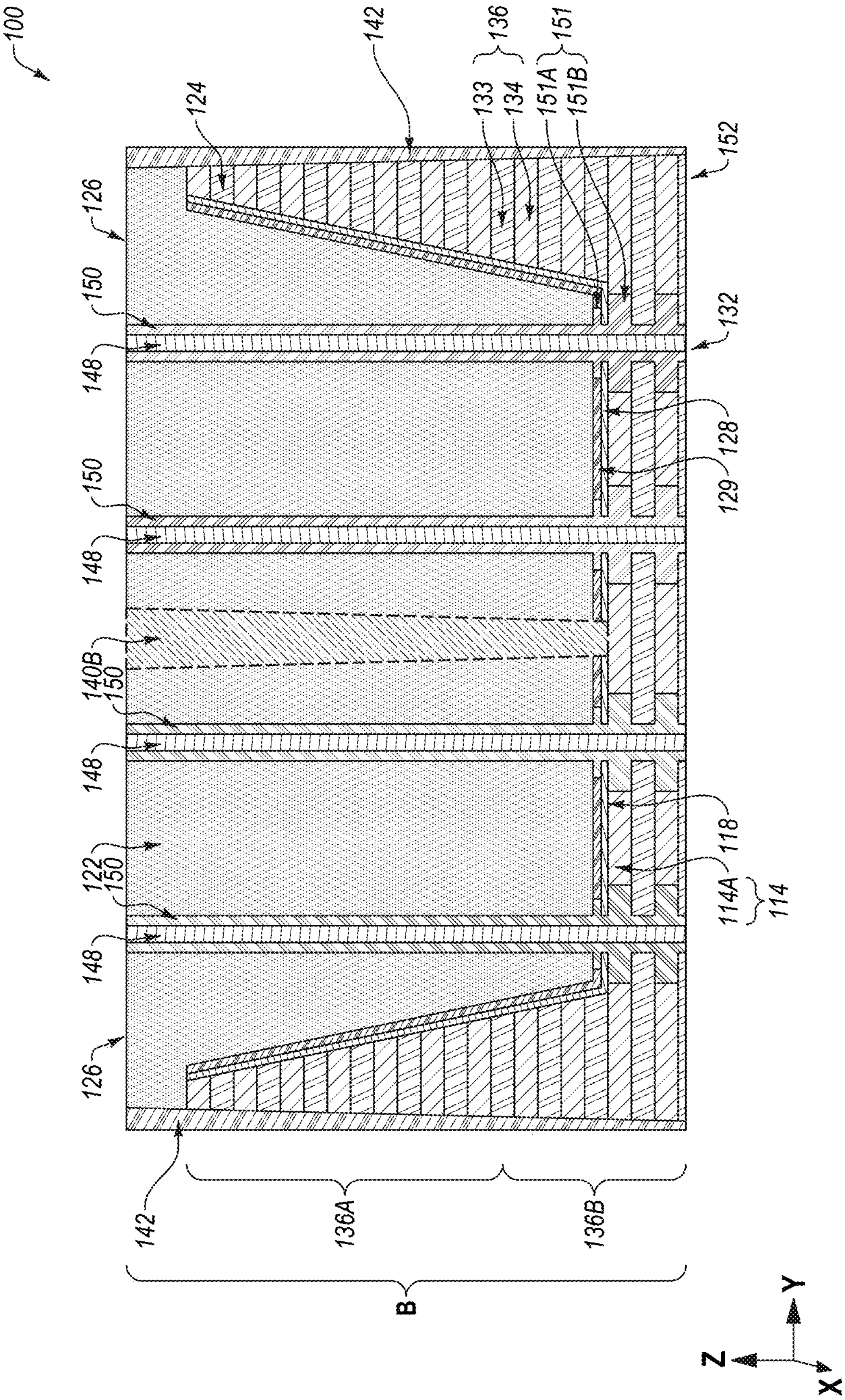
FIG. 7B is a simplified, longitudinal cross-sectional view of a portion of the microelectronic device structure at the processing stage of FIG. 7A about the dashed line B-B shown in FIG. 7A.
Figure 7C:
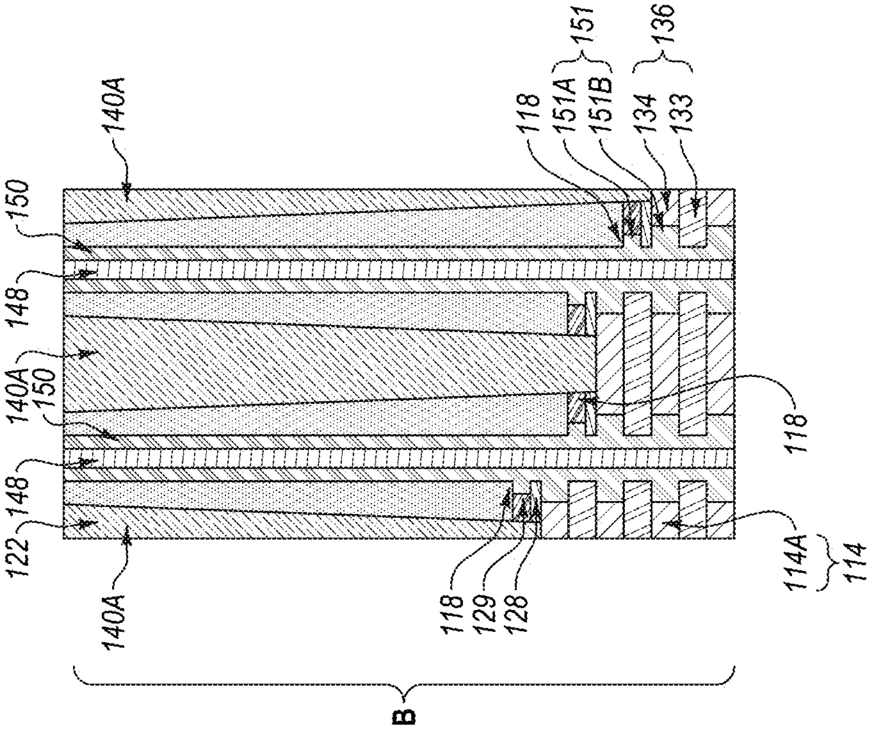
FIG. 7C is a magnified view of a sub-portion C (identified with dashed lines in FIG. 7A) of the simplified partial longitudinal cross-sectional view of the portion A of the microelectronic device structure shown in FIG. 7A.
Figure 7D:
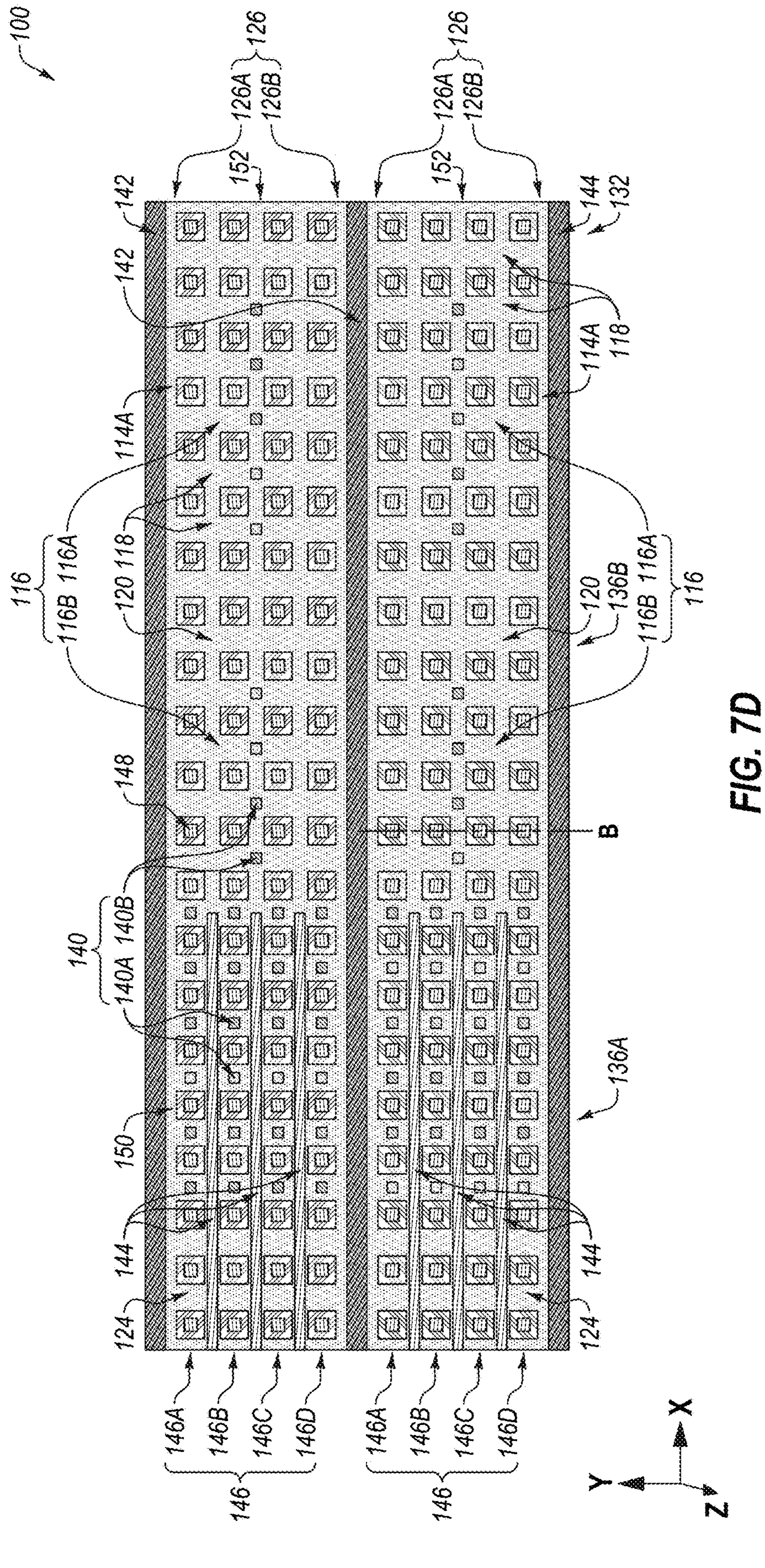
FIG. 7D is a simplified, partial top-down view of the microelectronic device structure at the processing stage of FIG. 7A.

Referring next to FIG. 7A, which is a longitudinal cross-sectional view of the portion A of the microelectronic device structure 100 subsequent to the processing stage previously described with reference to FIGS. 6A through 6C, contact structures 140 may be formed within the contact openings 138 (FIG. 6A). The contact structures 140 may be substantially confined within boundaries (e.g., horizontal boundaries, vertical boundaries) of the contact openings 138 (FIG. 6A), and may substantially fill the contact openings 138 (FIG. 6A). Each contact structure 140 may have a geometric configuration (e.g., shape, dimensions) corresponding to (e.g., substantially the same as) a geometric configuration of the contact opening 138 (FIG. 6A) filled with the contact structure 140. As shown in FIG. 7A, each contact structure 140 may have an uppermost vertical boundary (e.g., an uppermost surface) substantially coplanar with an uppermost vertical boundary (e.g., an uppermost surface) of the third dielectric material 130, and a lowermost vertical boundary (e.g., a lowermost surface) vertically adjacent an uppermost vertical boundary (e.g., an uppermost surface) of the conductive structures 134 of an individual tier 136 of the stack structure 132. Each contact structure 140 may individually contact (e.g., physically contact, electrically contact) the conductive structures 134 of the individual tier 136 of the stack structure 132 at an individual step 118 of an individual stadium structure 114 of an individual block 152 of the stack structure 132. FIG. 7B is a simplified, partial longitudinal cross-sectional view of a portion of the microelectronic device structure at the processing stage of FIG. 7A about a dashed line B-B shown in FIG. 6A. FIG. 7C is a magnified view of a sub-portion C (identified with dashed lines in FIG. 7A) of the simplified partial longitudinal cross-sectional view of the portion A of the microelectronic device structure shown in FIG. 7A. FIG. 7D is a simplified, partial top-down view of the microelectronic device structure 100 at the processing stage of FIG. 7A.

As shown in FIG. 7A, within a horizontal area of the first stadium structure 114A (e.g., a vertically uppermost stadium structure 114) within an individual block 152 of the stack structure 132, the contact structure 140 may include first contact structures 140A filling the first contact openings 138A (FIG. 3A), and second contact structures 140B filling the second contact openings 138B. Within horizontal boundaries of the block 152, the first contact structures 140A may vertically extend to and terminate at the relatively vertically higher tier(s) 136A of the stack structure 132, and the second contact structures 140B may vertically extend to and terminate at the relatively vertically lower tiers 136B of the stack structure 132. The first contact structures 140A may vertically extend to and physically contact upper select gate structures (e.g., SGD structures) of the block 152 formed by portions of the conductive structures 134 of individual relatively vertically higher tier(s) 136A of the stack structure 132. The second contact structures 140B may vertically extend to and physically contact local access line structures of the block 152 formed by the conductive structures 134 of individual relatively vertically lower tiers 136B of the stack structure 132.

The contact structures 140 may be formed of and include conductive material. As a non-limiting example, the contact structures 140 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 140 may be substantially the same as a material composition of the conductive structures 134 of the tiers 136 of the stack structure 132, or the material composition of the contact structures 140 may be different than the material composition of the conductive structures 134 of the tiers 136 of the stack structure 132. In some embodiments, the contact structures 140 are individually formed of and includes W. The contact structures 140 may individually be homogeneous, or the contact structures 140 may individually be heterogeneous.

The contact structures 140 may be formed by forming (e.g., non-conformably depositing, such as through one or more of a PVD process and a non-conformal CVD process) conductive material inside and outside of the contact openings 138 (FIG. 3A), and then removing (e.g., through an abrasive planarization process, such as a CMP process) portions of the conductive material overlying an uppermost vertical boundary (e.g., an uppermost surface) of the third dielectric material 130.

Referring to FIG. 7B, in some embodiments, for each of the blocks 152 of the stack structure 132, all of the second contact structures 140B are horizontally centered in at least the Y-direction on the steps 118 of the first stadium structure 114A in physical contact therewith. For example, a horizontal center in the Y-direction of each second contact structure 140B may be substantially aligned with a horizontal center in the Y-direction of the step 118 of the first stadium structure 114A that the second contact structure 140B physically contacts. In addition, a horizontal center in the X-direction of each second contact structure 140B may be substantially aligned with a horizontal center in the X-direction of the step 118 of the first stadium structure 114A that the second contact structure 140B physically contacts. In additional embodiments, for each of the blocks 152 of the stack structure 132, one or more of the second contact structures 140B are horizontally offset in the Y-direction from a horizontal center in the Y-direction of the step 118 of the first stadium structure 114A in physical contact therewith, and/or are horizontally offset in the X-direction from a horizontal center in the X-direction of the step 118 of the first stadium structure 114A in physical contact therewith. While not shown in FIG. 7B, horizontal positions of the first contact structures 140A (FIG. 7A) within a horizontal area of each of the blocks 152 of the stack structure 132 are described in further detail below with reference to FIG. 7D.

Referring collectively to FIGS. 7A and 7C, within a horizontal area of the first stadium structure 114A (e.g., a vertically uppermost stadium structure 114) within horizontal boundaries of the block 152, the second contact structures 140B may vertically extend to and terminate at the steps 118 of the relatively vertically lower tier(s) 136B of the stack structure 132, and the first contact structures 140A may vertically extend to and terminate at the steps 118 of the relatively vertically higher tier(s) 136A of the stack structure 132. Each of the contact structures 140 may individually be positioned horizontally between at least two support structures 148 (and, hence, liner structures 150) horizontally neighboring one another in the X-direction.

Referring collectively to FIGS. 7B and 7C, further remaining portions of the second dielectric material 129 may be horizontally interposed between the contact structures 140 and the first projections 151A of the liner structures 150. The further remaining portions of the second dielectric material 129 may horizontally extend (e.g., in the X-direction, in the Y-direction) from and between the contact structures 140 and the first projections 151A of the liner structures 150.

Referring next to FIG. 7D, each sub-block 146 of an individual block 152 of the stack structure 132 may individual include a row of the first contact structures 140A. For example, if an individual block 152 may be formed to include four (4) sub-blocks 146 (e.g., the first sub-block 146A, the second sub-block 146B, the third sub-block 146C, and the fourth sub-block 146D), each of the four (4) sub-blocks 146 may include one (1) row of the first contact structures 140A within a horizontal area thereof, such that the block 152 includes four (4) rows of the first contact structures 140A. Each row of the first contact structures 140A may horizontally extend in the X-direction, and may individually include a portion of the first contact structures 140A provided within a horizontal area of the block 152. In additional embodiments wherein an individual block 152 may be sub-divided into a different number of sub-blocks 146, the block 152 may include a different number of rows of the first contact structures 140A equal to the different number of sub-blocks 146. In addition, as depicted in FIG. 7D, within an individual block 152 of the stack structure 132, columns of the first contact structures 140A may horizontally extend in the Y-direction. Each column of the first contact structures 140A may include first contact structures 140A provided within different sub-blocks 146 of the block 152 than one another.

Still referring to FIG. 7D, each block 152 of the stack structure 132 may individually include a desired distribution of the second contact structures 140B within horizontal areas of the stadium structure 114. As shown in FIG. 7D, for an individual block 152 of the stack structure 132, the first stadium structure 114A may include at least one (1) row of the second contact structure 140B. Each row of the second contact structures 140B may horizontally extend in the X-direction, and may individually include a portion of the second contact structures 140B provided within a horizontal area of the block 152. For an individual block 152, the second contact structures 140B of each row may land on steps 118 of the first stadium structure 114A within vertical boundaries of the relatively vertically lower tiers 136B of the stack structure 132. In some embodiments, at least one of the opposing staircase structures 116 (e.g., the reverse staircase structure 116B and/or the forward staircase structure 116A) of the first stadium structure 114A includes a single (e.g., only one (1)) row of the second contact structures 140B within a horizontal area thereof. A horizontal centerline of the single row of the second contact structures 140B may be substantially aligned with a horizontal centerline of the block 152 (as depicted in FIG. 7D), or the horizontal centerline of the single row of the second contact structures 140B may be horizontally offset (e.g., in the Y-direction) from the horizontal centerline of the block 152. In additional embodiments, at least one of the opposing staircase structures 116 (e.g., the reverse staircase structure 116B and/or the forward staircase structure 116A) of the first stadium structure 114A includes more than one (1) row of the second contact structures 140B within a horizontal area thereof, such as at least two (2) rows of the second contact structures 140B, at least three (3) rows of the second contact structures 140B, or at least four (3) rows of the second contact structures 140B. In further embodiments, the second contact structure 140B are provided on steps 118 of the first stadium structure 114A in a different arrangement than in one or more of rows horizontally extending in the X-direction. For example, the second contact structure 140B may be arranged in a diagonal pattern extending substantially linearly in the X-direction and the Y-direction on steps 118 of the first stadium structure 114A, or may be arranged in an at least partially non-linear pattern (e.g., a curved pattern, a zigzag pattern, a random pattern, an irregular pattern) on steps 118 of the first stadium structure 114A.

Thus, in accordance with embodiments of the disclosure, microelectronic device comprises stack structure comprising a vertically alternating sequence of conductive material and insulative material arranged in tiers. The stack structure has blocks separated from one another by dielectric slot structures. Each of the blocks comprises a stadium structure, a filled trench vertically overlying and within horizontal boundaries of the stadium structure, support structures vertically extending through the filled trench and the at least some of the tiers of the stack structure, and dielectric liner structures substantially covering sidewalls of the support structures. The stadium structure comprises staircase structures each having steps comprising edges of at least some the tiers of the stack structure. The filled trench comprising a dielectric material interposed between at least two additional dielectric materials having a different material composition than the dielectric material. The dielectric liner structures comprise first protrusions at vertical positions of the dielectric material, and second protrusions at vertical positions of the conductive material of the at least some the tiers of the stack structure. The second protrusions have greater horizontal dimensions than the first protrusions.

Furthermore, in accordance with embodiments of the disclosure, a method of forming a microelectronic device comprises forming a preliminary stack structure comprising a vertically alternating sequence of sacrificial material and insulative material arranged in tiers. The preliminary stack structure further comprising rows of stadium structures each comprising at least two of the stadium structures neighboring one another in a first horizontal direction and each comprising staircase structures having steps comprising edges of at least some of the tiers of the preliminary stack structure. A dielectric liner material is formed over the steps of the staircase structures of the at least two of the stadium structures. Additional dielectric liner material is formed over the dielectric liner material using a material deposition process employing a temperature greater than or equal to about 630° C. Dielectric fill material is formed over the additional dielectric liner material to substantially fill trenches overlying and within horizontal areas of the at least two of the stadium structures. Support structures are formed to vertically extend through the dielectric fill material, the additional dielectric liner material, the dielectric liner material, and the at least some of the tiers of the preliminary stack structure. The sacrificial materials of the preliminary stack structure are replaced with conductive material after forming the support structures.

Figure 8:
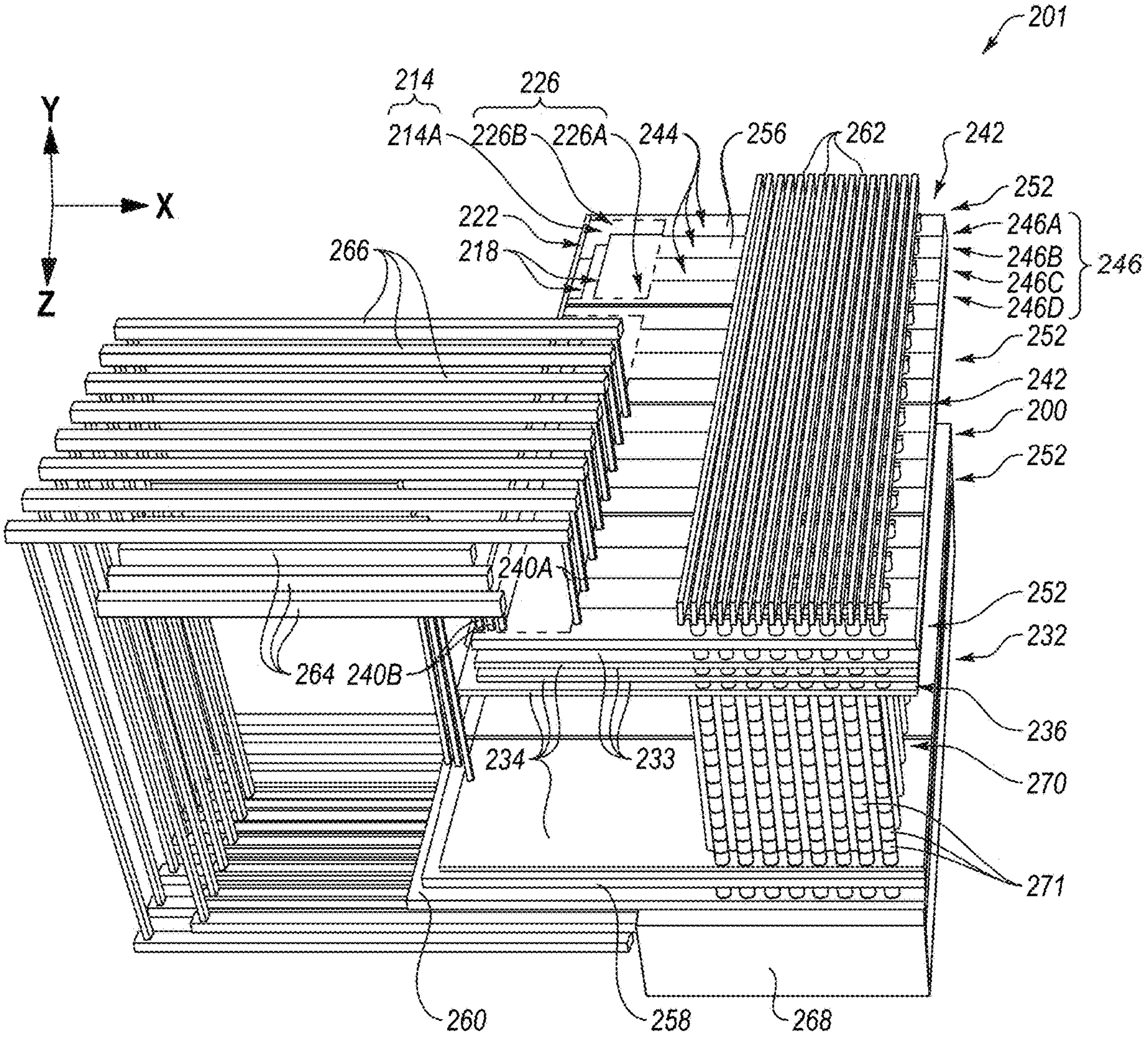
FIG. 8 is a simplified partial cutaway perspective view of a microelectronic device, in accordance with embodiments of the disclosure.

Microelectronic device structures (e.g., the microelectronic device structure 100 following the processing stage previously described with reference to FIGS. 7A through 7D) of the disclosure may be included in microelectronic devices of the disclosure. For example, FIG. 8 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to of the microelectronic device structure 200 previously described with reference to FIGS. 7A through 7D. In FIG. 8 and the associated description, functionally similar features (e.g., structures, materials) are referred to with similar reference numerals incremented by 100. To avoid repetition, not all features shown in FIG. 8 are described in detail herein. Rather, unless described otherwise below, a feature designated by a reference numeral that is a 100 increment of the reference numeral of a previously described feature will be understood to be substantially similar to the previously described feature. By way of non-limiting example, unless described otherwise below, a feature designated by the reference numeral 222 in FIG. 8 will be understood to be substantially similar to the filled trenches 122 (including the first dielectric material 128, the second dielectric material 129, and the third dielectric material 130 thereof) previously described herein with reference to one or more of FIGS. 7A through 7D. In addition, for clarity and ease of understanding the drawings and associated description, some features (e.g., structures, materials) of the microelectronic device structure 100 previously described herein are not shown in FIG. 8. However, it will be understood that any features of the microelectronic device structure 100 previously described with reference to one or more of FIGS. 7A through 7D may be included in the microelectronic device structure 200 of the microelectronic device 201 described herein with reference to FIG. 8.

As shown in FIG. 8, in addition to the features of the microelectronic device structure 200 previously described herein in relation to the microelectronic device structure 100 (FIGS. 7A through 7D), the microelectronic device 201 may further include cell pillar structures 270 vertically extending through each block 252 of the stack structure 232. The cell pillar structures 270 may be positioned within regions (e.g., memory array regions) of the block 252 horizontally offset (e.g., in the X-direction) from the stadium structures 214 (e.g., the first stadium structure 214A) (and, hence, the bridge regions 226) within the blocks 252. Intersections of the cell pillar structures 270 and the conductive structures 234 of the tiers 236 of the stack structure 232 within the horizontal areas of the blocks 252 form strings of memory cells 271 vertically extending through each block 252 of the stack structure 232. For each string of memory cells 271, the memory cells 271 thereof may be coupled in series with one another. Within each block 252, the conductive structures 234 of some of the tiers 236 of the stack structure 232 may serve as access line structures (e.g., word line structures) for the strings of memory cells 271 within the horizontal area of the block 252. In some embodiments, within each block 252, the memory cells 271 formed at the intersections of the conductive structures 234 of some of the tiers 236 and the cell pillar structures 270 comprise so-called "MONOS" (metal-oxide-nitride-oxide-semiconductor) memory cells. In additional embodiments, the memory cells 271 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 271 comprise so-called "floating gate" memory cells including floating gates (e.g., metallic floating gates) as charge storage structures. The floating gates may horizontally intervene between central structures of the cell pillar structures 270 and the conductive structures 234 of the different tiers 236 of the stack structure 232.

The microelectronic device 201 may further include at least one source structure 260, access line routing structures 264, first select gates 256 (e.g., upper select gates, drain select gates (SGDs)), select line routing structures 266, one or more second select gates 258 (e.g., lower select gates, source select gate (SGSs)), and digit line structures 262. The digit line structures 262 may vertically overlie and be coupled to the cell pillar structures 270 (and, hence, the strings of memory cells 271). The source structure 260 may vertically underlie and be coupled to the cell pillar structures 270 (and, hence, the strings of memory cells 271). In addition, the first contact structures 240A (e.g., select line contact structures) and the second contact structures 240B (e.g., access line contact structures) may couple various features of the microelectronic device 201 to one another as shown (e.g., the select line routing structures 266 to the first select gates 256; the access line routing structures 264 to the conductive structures 234 of the tiers 236 of the stack structure 232 underlying the first select gates 256 and defining access line structures of the microelectronic device 201).

The microelectronic device 201 may also include a base structure 268 positioned vertically below the cell pillar structures 270 (and, hence, the strings of memory cells 271). The base structure 268 may include at least one control logic region including control logic devices configured to control various operations of other features (e.g., the strings of memory cells 271) of the microelectronic device 201. As a non-limiting example, the control logic region of the base structure 268 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 268 may be coupled to the source structure 260, the access line routing structures 264, the select line routing structures 266, and the digit line structures 262. In some embodiments, the control logic region of the base structure 268 includes CMOS (complementary metal-oxide-semiconductor) circuitry. In such embodiments, the control logic region of the base structure 268 may be characterized as having a "CMOS under Array" ("CuA") configuration.

Thus, in accordance with embodiments of the disclosure, a memory device comprises a stack structure comprising tiers each comprising a conductive material and an insulative material vertically neighboring the conductive material, the stack structure divided into blocks extending in parallel in a first direction and separated from one another in a second direction by dielectric slot structures. Each of the blocks comprises a stadium structure comprising opposing staircase structures individually having steps comprising horizontal ends of at least some the tiers of the stack structure; first elevated regions neighboring opposing ends of the stadium structure in the first direction; and second elevated regions neighboring opposing sides of the stadium structure in the second direction, uppermost surfaces of the second elevated regions substantially coplanar with uppermost surfaces of the first elevated regions. The memory device further comprises dielectric-filled trenches within the blocks of the stack structure. Each of the dielectric-filled trenches vertically overlies and is within a horizontal area of the stadium structure of one of the blocks of the stack structure. Each of the dielectric-filled trenches comprises an oxide liner on surfaces of the stadium structure, the first elevated regions, and the second elevated regions; a nitride liner on surfaces of the oxide liner; and an oxide fill material over the nitride liner. The memory device further comprises conductive contacts vertically extending through the dielectric-filled trenches to at least some of the steps of the stadium structure of each of the blocks. Each of the conductive contacts is horizontally circumscribed by and physically contacts the nitride liner of one of the dielectric-filled trenches. The memory device further comprises strings of memory cells vertically extending through a portion of each of the blocks neighboring the stadium structure in the first direction.

Figure 9:
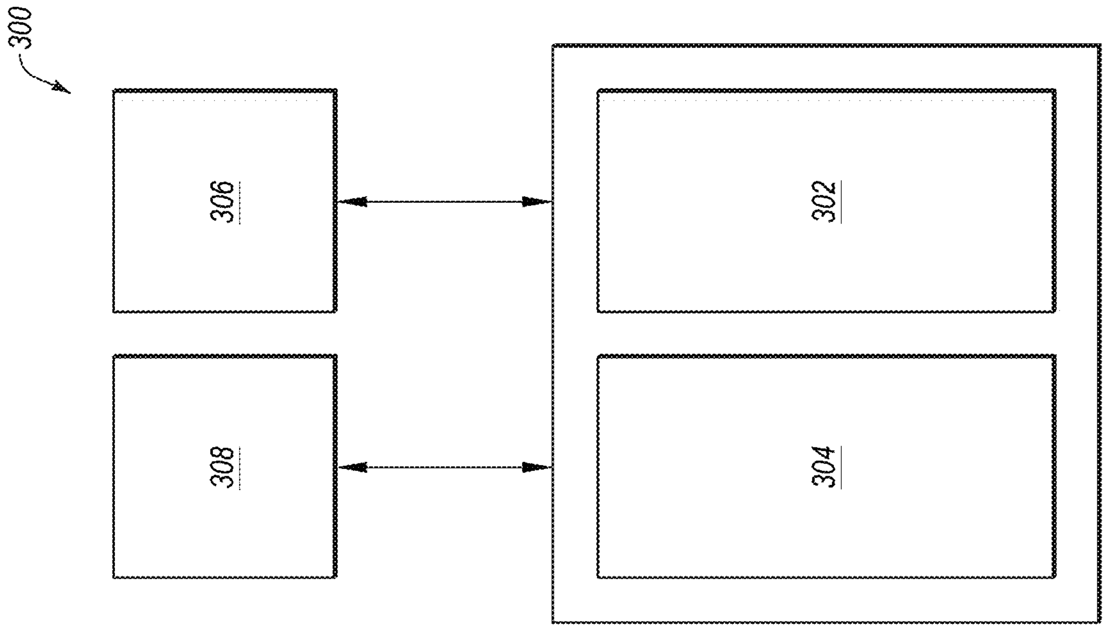
FIG. 9 is a schematic block diagram illustrating an electronic system, in accordance with embodiments of the disclosure.

Microelectronic devices structures (e.g., the microelectronic device structures 100, 200 previously described with reference to one or more of FIGS. 7A through 7D, and 8) and microelectronic devices (e.g., the microelectronic device 201 previously described with reference to FIG. 8) in accordance with embodiments of the disclosure may be used in embodiments of electronic systems of the disclosure. For example, FIG. 9 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structures 100, 200 previously described with reference to one or more of FIGS. 7A through 7D, and 8) and a microelectronic device (e.g., the microelectronic device 201 previously described with reference to FIG. 8) previously described herein. The electronic system 300 may further include at least one electronic signal processor device 304 (often referred to as a "microprocessor"). The electronic signal processor device 304 may, optionally, include one or more of a microelectronic device structure (e.g., one of the microelectronic device structures 100, 200 previously described with reference to one or more of FIGS. 7A through 7D, and 8) and a microelectronic device (e.g., the microelectronic device 201 previously described with reference to FIG. 8) previously described herein. While the memory device 302 and the electronic signal processor device 304 are depicted as two (2) separate devices in FIG. 9, in additional embodiments, a single (e.g., only one) memory/processor device having the functionalities of the memory device 302 and the electronic signal processor device 304 may be included in the electronic system 300. In such embodiments, the memory/processor device may include one or more of a microelectronic device structure (e.g., the microelectronic device structures 100, 200 previously described with reference to one or more of FIGS. 7A through 7D, and 8) and a microelectronic device (e.g., the microelectronic device 201 previously described with reference to FIG. 8) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising a vertically alternating sequence of conductive material and insulative material arranged in tiers. The stack structure further comprises at least two blocks separated by at least one dielectric structure. Each of the at least two blocks comprises two elevated regions, a stadium structure, and two additional elevated regions. The stadium structure is interposed between the two elevated regions in a first horizontal direction and comprising staircase structures opposing one another in the first horizontal direction. The staircase structures each have steps comprising edges of the tiers of the stack structure. The two additional elevated regions neighboring opposing sides of the stadium structure in a second horizontal direction perpendicular to the first horizontal direction. The memory device further comprises filled trenches over and within horizontal boundaries of the at least two blocks of the stack structure. Each of the filled trenches comprises a first dielectric liner material on surfaces of the stadium structure, the two elevated regions, and the two additional elevated regions of one of the at least two blocks of the stack structure; a second dielectric liner material structures on surfaces of the first dielectric liner material; and a dielectric fill material on surfaces of the first dielectric liner material. The memory device further comprises support structures vertically extending through the filled trench and the at least some of the tiers of the stack structure. The memory device further comprises dielectric liner structures substantially covering sidewalls of the support structures and comprising first protrusions at vertical positions of the second dielectric liner material; and second protrusions at vertical positions of the conductive material of the tiers of the stack structure. The second protrusions have greater horizontal dimensions than the first protrusions. Conductive contact structures are horizontally interposed between the dielectric liner structures and vertically extend completely through the filled trenches.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A method of forming a microelectronic device, comprising:

forming a preliminary stack structure comprising a vertically alternating sequence of sacrificial material and insulative material arranged in tiers, the preliminary stack structure further comprising rows of stadium structures each comprising:

at least two of the stadium structures neighboring one another in a first horizontal direction and each comprising staircase structures having steps comprising edges of at least some of the tiers of the preliminary stack structure;

forming dielectric liner material over the steps of the staircase structures of the at least two of the stadium structures;

forming additional dielectric liner material over the dielectric liner material using a material deposition process employing a temperature greater than or equal to about 630° C.;

forming dielectric fill material over the additional dielectric liner material to substantially fill trenches overlying and within horizontal areas of the at least two of the stadium structures;

forming openings vertically extending through the dielectric fill material, the additional dielectric liner material, the dielectric liner material, and the at least some of the tiers of the preliminary stack structure, wherein the openings comprise:

a first horizontally projecting portion formed by horizontally recessing the additional dielectric liner material;

at least one second horizontally projecting portions formed by horizontally recessing the sacrificial material of the at least some of the tiers of the preliminary stack structure; and the first horizontal projecting portion has a smaller horizontal dimension than the at least one second horizontally projecting portions;

forming support structures in the openings; and replacing the sacrificial material of the preliminary stack structure with a conductive material after forming the support structures.

2. The method of claim 1, wherein forming the additional dielectric liner material over the dielectric liner material comprises conformally forming the additional dielectric liner material using a chemical vapor deposition (CVD) process employing a CVD process temperature within a range of from about 680° C. to about 760° C.

3. The method of claim 2, wherein forming the openings comprises:

forming initial openings vertically extending through the dielectric fill material, the additional dielectric liner material, the dielectric liner material, and the at least some of the tiers of the preliminary stack structure;

forming modified openings including the first horizontally projecting portion and the at least one second horizontally projecting portions by horizontally recessing the additional dielectric liner material and the sacrificial material of the at least some of the tiers of the preliminary stack structure relative to the dielectric liner material and the insulative material of the at least some of the tiers of the preliminary stack structure;

partially filling the modified openings with further dielectric liner material, the further dielectric liner material substantially filling the first horizontally projecting portion and the at least one second horizontally projecting portions of the modified openings; and filling remaining portions of the modified openings with a conductive material after partially filling the modified openings with the further dielectric liner material.

4. The method of claim 3, wherein horizontally recessing the additional dielectric liner material and the sacrificial material comprises:

forming the first horizontally projecting portion of the modified openings at a vertical elevation of the additional dielectric liner material; and forming the at least one second horizontally projecting portions of the modified openings at vertical elevations of the sacrificial material of the at least some of the tiers of the preliminary stack structure.

5. The method of claim 1, further comprising:

dividing the preliminary stack structure into blocks separated from one another by slots after forming support structures, each of the blocks comprising one of the rows of stadium structures; and replacing the sacrificial material of the preliminary stack structure with the conductive material by way of the slots.

6. The method of claim 5, wherein dividing the preliminary stack structure into blocks separated from one another by the slots comprises forming each of the blocks to further comprise:

at least one crest region interposed between the at least two of the stadium structures of the one of the rows of stadium structures in the first horizontal direction; and bridge regions integral and continuous with the at least one crest region and neighboring the at least two of the stadium structures in a second horizontal direction orthogonal to the first horizontal direction.

7. The method of claim 1, further comprising, after replacing the sacrificial material of the preliminary stack structure with the conductive material, forming conductive contact structures vertically extending through the dielectric fill material, the additional dielectric liner material, the dielectric liner material, and physically contacting the conductive material of the at least some of the tiers at the steps of at least one of the staircase structures.

8. The method of claim 7, wherein forming the conductive contact structures comprises forming each of the conductive contact structures horizontally between at least two of the support structures neighboring one another.

9. The method of claim 8, wherein forming each of the conductive contact structures horizontally between the at least two of the support structures neighboring one another comprises maintaining portions of the additional dielectric liner material horizontally between each of the conductive contact structures and the at least two of the support structures.

10. A method of forming a microelectronic device, comprising:

forming a preliminary stack structure comprising:

tiers respectively including sacrificial material and insulative material vertically neighboring the sacrificial material; and a stadium structure having steps comprising horizontal ends of some of the tiers;

forming a filled trench within a horizontal area of the stadium structure and comprising:

a first dielectric material on the steps of the stadium structure; and a second dielectric material on the first dielectric material and having a greater density than each of the sacrificial material and the first dielectric material;

forming openings within the horizontal area of the stadium structure and vertically extending through the filled trench and portions of the preliminary stack structure thereunder, the openings respectively comprising:

a first projecting portion horizontally extending into the second dielectric material and having a first horizontal dimension; and at least one second projecting portions horizontally extending into the sacrificial material of the tiers and having a second horizontal dimension that is larger than the first horizontal dimension of the first projecting portion;

forming support structures within the openings; and replacing the sacrificial material of the tiers with a conductive material.

11. The method of claim 10, wherein forming the filled trench comprises conformally forming the second dielectric material on the first dielectric material using a chemical vapor deposition process employing a temperature within a range of from about 680° C. and about 760° C.

12. The method of claim 11, further comprising:

forming the first dielectric material to comprise dielectric nitride material; and forming the second dielectric material to comprise additional dielectric nitride material.

13. The method of claim 10, wherein forming the openings comprises:

forming the first projecting portion at a vertical position of the second dielectric material; and forming the at least one second projecting portions at vertical positions of the sacrificial material of the tiers.

14. The method of claim 10, wherein forming the support structures within the openings comprises:

forming a dielectric liner material within the openings, the dielectric liner material partially filling the openings and substantially covering surfaces of the filled trench and the preliminary stack structure defining the openings; and forming conductive structures within the openings after forming the dielectric liner material, the dielectric liner material substantially covering sidewalls of the conductive structures.

15. The method of claim 14, wherein forming the dielectric liner material within the openings comprises substantially filling the first projecting portion and the at least one second projecting portions of the openings with the dielectric liner material.

16. The method of claim 15, further comprising forming the dielectric liner material to have a different material composition than each of the first dielectric material, the second dielectric material, and the sacrificial material of the tiers.

17. The method of claim 15, further comprising forming conductive contact structures within the horizontal area of the stadium structure after replacing the sacrificial material of the tiers with the conductive material, the conductive contact structures respectively vertically extending through the filled trench and extend to a vertical position of one of the steps of the stadium structure.

18. A method of forming a microelectronic device, comprising:

forming a stack structure comprising:

tiers individually including nitride material and oxide material vertically adjacent the nitride material; and a stadium structure having steps comprising edges of some of the tiers;

forming a filled trench within a horizontal area of the stadium structure and comprising:

a nitride liner on and substantially covering the steps of the stadium structure;

an additional nitride liner on and substantially covering the nitride liner, the additional nitride liner having a greater density than the nitride liner; and additional oxide material on and substantially covering the additional nitride liner;

forming pillars within the horizontal area of the stadium structure and vertically extending through the filled trench and portions of the stack structure thereunder, the pillars individually comprising:

a first region outwardly horizontally projecting into the additional nitride liner;

second regions outwardly horizontally projecting into the nitride material of the tiers; and the first region has a smaller horizontal dimension than the second regions; and replacing the nitride material of the tiers with a conductive material after forming the pillars.

19. The method of claim 18, wherein forming the filled trench comprises forming the additional nitride liner on the nitride liner at a temperature greater than or equal to about 630° C.

20. The method of claim 18, wherein each of the pillars comprises:

a conductive structure; and an oxide liner material on and substantially covering sidewalls of the conductive structure, the oxide liner material forming the first region and the second regions.

* * * * *